(12) United States Patent
Pani et al.

(10) Patent No.: US 7,876,126 B2
(45) Date of Patent: Jan. 25, 2011

(54) PERMUTABLE SWITCHING NETWORK WITH ENHANCED INTERCONNECTIVITY FOR MULTICASTING SIGNALS

(75) Inventors: Peter M. Pani, Mountain View, CA (US); Benjamin S. Ting, Saratoga, CA (US)

(73) Assignee: Advantage Logic, Inc., Cupertino, CA (US)

( * ) Notice: Subject to any disclaimer, the term of this patent is extended or adjusted under 35 U.S.C. 154(b) by 0 days.

(21) Appl. No.: 12/720,138

(22) Filed: Mar. 9, 2010

(65) Prior Publication Data

US 2010/0156461 A1   Jun. 24, 2010

Related U.S. Application Data

(63) Continuation of application No. 12/327,702, filed on Dec. 3, 2008, now Pat. No. 7,705,629.

(51) Int. Cl.
*H01L 25/00* (2006.01)
(52) U.S. Cl. .......................... 326/41; 326/47
(58) Field of Classification Search .......... 326/38–41, 326/47, 101
See application file for complete search history.

(56) References Cited

U.S. PATENT DOCUMENTS

| | | | |
|---|---|---|---|
| 4,758,745 | A | 7/1988 | Elgamal et al. |
| 4,870,302 | A | 9/1989 | Freeman |
| 5,144,166 | A | 9/1992 | Camarota et al. |
| 5,260,610 | A | 11/1993 | Pedersen et al. |
| 5,260,611 | A | 11/1993 | Cliff et al. |
| 5,396,126 | A | 3/1995 | Britton et al. |
| 5,457,410 | A | 10/1995 | Ting |
| 5,469,003 | A | 11/1995 | Kean |
| 5,598,109 | A * | 1/1997 | Leong et al. ............ 326/41 |
| 5,825,202 | A | 10/1998 | Tavana et al. |
| 5,841,775 | A | 11/1998 | Huang |
| 5,883,526 | A | 3/1999 | Reddy et al. |
| 5,914,616 | A | 6/1999 | Young et al. |
| 6,051,991 | A | 4/2000 | Ting |
| 6,417,694 | B1 | 7/2002 | Reddy et al. |
| 6,507,217 | B2 | 1/2003 | Ting |
| 6,594,810 | B1 | 7/2003 | Reblewski et al. |
| 6,597,196 | B2 | 7/2003 | Ting |
| 6,693,456 | B2 | 2/2004 | Wong |
| 6,747,482 | B2 | 6/2004 | Ting |

(Continued)

OTHER PUBLICATIONS

International Search Report and Written Opinion of the International Searching Authority mailed Nov. 25, 2009 for PCT/US09/58818 filed Sep. 29, 2009, 17 pages.

Shoup, R.G., "Programmable Cellular Logic Arrays", Abstract, Ph.D. Dissertation, Carnegie Mellon University, Pittsburg, Pennsylvania, Mar. 1970, pp. ii-121.

(Continued)

*Primary Examiner*—Rexford N Barnie
*Assistant Examiner*—Crystal L Hammond
(74) *Attorney, Agent, or Firm*—Blakely, Sokoloff, Taylor & Zafman LLP

(57) ABSTRACT

In one embodiment, the integrated circuit has a L-level permutable switching network (L-PSN) comprising L levels of intermediate conductors. The integrated circuit can be used in electronic devices, such as switching networks, routers, and programmable logic circuits, etc.

48 Claims, 19 Drawing Sheets

U.S. PATENT DOCUMENTS

| | | |
|---|---|---|
| 6,940,308 B2 | 9/2005 | Wong |
| 6,975,139 B2 | 12/2005 | Pani et al. |
| 7,065,076 B1 | 6/2006 | Nemazie |
| 7,123,612 B2 | 10/2006 | Lu |
| 7,142,012 B2 | 11/2006 | Ting |
| 7,256,614 B2 | 8/2007 | Pani et al. |
| 7,417,457 B2 | 8/2008 | Pani et al. |
| 7,423,453 B1 | 9/2008 | Ting et al. |
| 7,557,613 B2 | 7/2009 | Pani et al. |
| 2001/0007428 A1 | 7/2001 | Young et al. |
| 2002/0186044 A1 | 12/2002 | Agrawal et al. |
| 2007/0285126 A1* | 12/2007 | Kaptanoglu .................. 326/41 |
| 2009/0273368 A1 | 11/2009 | Pani et al. |

OTHER PUBLICATIONS

Spandorfer, L.M., "Synthesis of Logic Functions on an Array of Integrated Circuits", Contract: AF 19 (628) 2907, Project: 4645, Task: 464504, Final Report, Nov. 30, 1965.

Notice of allowance mailed Dec. 10, 2009 for U.S. Appl. No. 12/327,702, filed Dec. 3, 2008, 14 pages.

Notice of allowance mailed Dec. 10, 2009 for U.S. Appl. No. 12/327,704, filed Dec. 3, 2008, 15 pages.

Notice of Allowance mailed Jun. 7, 2010 for U.S. Appl. No. 12/703,624, filed Feb. 10, 2010, 14 pages.

* cited by examiner $M = I[0], K = D[2], D[1] = N, K_S = D_S[2]$ $M = I[0], K = D[2], D[1] = N, K_S = D_S[2]$ $M = I[0], N_S = D_S[1], I = I[1], K_S = D_S[2], I N = I D[1], N = D[1], K = D[2], L = 1$

PERMUTABLE SWITCHING NETWORK WITH ENHANCED INTERCONNECTIVITY FOR MULTICASTING SIGNALS

RELATED APPLICATIONS

This is a continuation application of application Ser. No. 12/327,702, filed Dec. 3, 2008 now U.S. Pat. No. 7,705,629, which is hereby incorporated by reference. This application is related to U.S. patent application Ser. No. 12/327,704, filed Dec. 3, 2008, which is assigned to the same assignee as the current application.

TECHNICAL FIELD

Embodiments of this invention relate to switching networks used in an interconnection fabric for switching systems, router and, in particular, to switching networks used with programmable logic circuits.

BACKGROUND

A programmable logic circuit, also referred to as field programmable gate array (FPGA) is an off the shelf integrated logic circuit which can be programmed by the user to perform logic functions. Circuit designers define the desired logic functions and the circuit is programmed to process the signals accordingly. Depending on logic density requirements and production volumes, programmable logic circuits are superior alternatives in terms of cost and time to market. A typical programmable logic circuit is composed of logic cells where each of the logic cells can be programmed to perform logic functions on its input variables. Additionally, interconnect resources are provided throughout the programmable logic circuit which can be programmed to conduct signals from outputs of logic cells to inputs of logic cells according to user specification.

As technology progresses to allow for larger and more sophisticated programmable logic circuits, both the number of logic cells and the required interconnect resources increases in the circuit. Competing with the increased number of logic cells and interconnect resources is the need to keep the circuit size small. One way to minimize the required circuit size is to minimize the interconnect resources while maintaining a certain level of connectivity. Therefore, it can be seen that as the functionality implemented on the chip increases, the interconnection resources required to connect a large number of signals can be quickly exhausted. The trade-offs are either to provide for a lower utilization of logic cells in a circuit while keeping the circuit size small or to provide more routing resources that can increase the circuit size dramatically.

There has been a progression of increasingly complex connection styles over the last forty years in the field of programmable logic circuits. L. M. Spandorfer in 1965 describes possible implementation of a programmable logic circuit using neighborhood interconnection, and connections through multiple conductors using switches in a Clos network. R. G. Shoup in his PhD thesis of 1970 describes both the use of a neighborhood interconnect and the use of a bus for longer distance interconnect.

Freeman in the U.S. Pat. No. 4,870,302 of 1989 describes a commercial implementation of a FPGA using neighborhood interconnects, short (length one, called single) distance interconnects, and global lines for signals such as clocks. The short distance interconnects interact with the inputs and outputs of logic cells where each input is connected through switches to every short wire neighboring to a logic cell and horizontal and vertical short wires connect through a switch box in a junction. El Gamal et al. in U.S. Pat. No. 4,758,745 introduces segmented routing where inputs and outputs of logic cells interact with routing segments of different lengths in one dimension.

Peterson et al. in U.S. Pat. No. 5,260,610 and Cliff et al. in U.S. Pat. No. 5,260,611 introduce a local set of conductors interfacing with a set of logic elements where every input of the logic elements is connected, through switches, to every local conductor in the set; additional chip length conductors are introduced both horizontally and vertically where the horizontal conductor can connect to the vertical conductors and the horizontal conductors connect to multiple local conductors. In U.S. Pat. No. 4,870,302, U.S. Pat. No. 4,758,745, U.S. Pat. No. 5,260,610, and U.S. Pat. No. 5,260,611, the input conductor of a logic cell has full connections to the set of local conductors (e.g. for n-inputs and k-local conductors, there is n×k switches connecting the inputs to the local conductors. A multiplexer (MUX) scheme may also be used so that the number of transistors is reduced.). In U.S. Pat. No. 4,870,302, U.S. Pat. No. 4,758,745, U.S. Pat. No. 5,260,610, and U.S. Pat. No. 5,260,611, the general interconnect resources are limited to one or two different lengths (i.e. singles of U.S. Pat. No. 4,870,302, local and chip length in U.S. Pat. No. 5,260,610 and U.S. Pat. No. 5,260,611) or limited in one dimension (i.e. different lengths horizontally in U.S. Pat. No. 4,758,745, local vertically in U.S. Pat. No. 5,260,610 and U.S. Pat. No. 5,260,611).

Camarota et al. in U.S. Pat. No. 5,144,166 and Kean in U.S. Pat. No. 5,469,003 introduce a routing scheme with more than two different lengths in both dimensions with limitations in the reach of those conductors. While U.S. Pat. No. 5,144,166 allows each wire to be selectively driven by more than one possible driving source, U.S. Pat. No. 5,469,003 is limited to be unidirectional in that each wire is hardwired to a multiplexer output. The connectivity provided in both U.S. Pat. No. 5,144,166 and U.S. Pat. No. 5,469,003 are very low, based on the premises that either connections are neighborhood or relatively local, or logic cells itself can be used as interconnection resources instead of performing logic functions. Ting in U.S. Pat. No. 5,457,410, U.S. Pat. No. 6,507,217, U.S. Pat. No. 6,051,991 and U.S. Pat. No. 6,597,196 described a multiple level architecture where multiple lengths of conductors interconnect through switches in a hierarchy of logic cells.

Young et al. in U.S. 2001/0007428 and U.S. Pat. No. 5,914,616 describe an architecture with multiple lengths of wires in two dimensions (three in each dimension) where for short local connections, a near cross-bar scheme is used where a set of logic cells outputs are multiplexed to a reduced set of output ports which then interface to other interconnect resources. The longer wires generally fan-in into shorter length wires in a respective dimension. Reddy et al. in U.S. Pat. No. 6,417,694 discloses another architecture where inter-super-region, inter-region, and local conductors are used. A cross-bar scheme is used at the lowest level (using multiplexers) for the local wires to have universal access to the inputs of the logic elements. Reddy et al. in U.S. Pat. No. 5,883,526 discloses various schemes having circuit reduction techniques in the local cross-bar.

Reblewski et al. in U.S. Pat. No. 6,594,810 describes an architecture building a programmable logic circuit using crossbar devices recursively. Wong in U.S. Pat. No. 6,693,456 and U.S. Pat. No. 6,940,308 use Benes switching networks as the interconnection fabric for programmable logic circuit.

At the base level of circuit hierarchy, multiple-input Look Up Table (LUT) logic cells are commonly used. There are two advantages in using a LUT as the base logic cell. One advantage is that the LUT allows programmable implementation of any Boolean functions having up to the multiple-input and one output. Another advantage is that the multiple inputs are interchangeable and logically equivalent. Hence it does not matter which signal connecting to which input pin of the LUT for the LUT to function correctly as long as those signals connect to the respective inputs of the LUT.

A common problem to be solved in any programmable logic circuit is that of interconnectivity, namely, how to connect a first set of conductors carrying signals to a second multiple sets of conductors to receive those signals where the logic cells originating the signals and the logic cells receiving the signals are spread over a wide area in an integrated circuit (i.e., M number of outputs from M or less number of logic cells where one or more outputs of each logic cell connects to inputs of one or more logic cells). A conventional solution is to use a cross bar switch where every conductor of the first set is connectable to every conductor in the second multiple sets of conductors directly through a switch. Unfortunately, this approach is impractical in most cases. Prior solutions in one degree or another try to divide the connectivity problem into multiple pieces using a divide and conquer strategy where local clusters of logic cells are interconnected and extended to other clusters of logic, either through extensions of local connections or using longer distance connections. These prior interconnect schemes are ad hoc and mostly based on empirical experiences. A desired routing model or interconnect architecture should enable or guarantee full connectivity for a large number of inputs and outputs over a large part of the circuit all the time.

U.S. Pat. No. 6,975,139, U.S. Pat. No. 7,256,614 and U.S. Pat. No. 7,417,457 by the present inventors describe an L-level switching network (L-SN) which uses switches and L levels of intermediate conductors of I[i] number of conductors consisting of D[i] sets of conductors for i=[1:L] to connect a first plurality or set of M number of conductors to a second K sets of conductors of (K×N) number of conductors. The L-SN can be used as part of an interconnection fabric for a programmable logic circuit with much reduced switch counts and the number of switches used in the switching network is determined by a mathematical relations of the sizes of the first set of M number of conductors and the size and number of the second K sets of conductors of (K×N) number of conductors. The switching network, when limited to be a 1-SN or at the last intermediate stage or level in the conventional design, can have certain routing limits when at least one multicasting signal is logically grouped together with other signals from the first set of conductors in a skewed distribution. Thus, it is desirable to have an enhanced permutable switching network for programmable logic circuits where the routability or interconnectivity may be enhanced in the presence of multicasting signals independent of signal distribution while the cost of interconnections remains low in terms of number of switches and the software efforts in determining a place and route and the circuit layout implementation may be simplified.

One type of a L-level switching network (L-SN) which uses switches and L levels of intermediate conductors of I[i] number of conductors consisting of D[i] sets of conductors for i=[1:L] to connect a first plurality or set of M number of conductors to a second K sets of conductors of (K×N) number of conductors was first described by the present inventors in U.S. Pat. No. 6,975,139, U.S. Pat. No. 7,256,614 and U.S. Pat. No. 7,417,457. There are (L+2) levels of conductors in an L-SN: an 0-th level of conductors or pins of M or I[0] number of conductors or pins, i-th level of conductors of I[i] number of conductors consisting of D[i] sets of conductors for i=[1:L] and an (L+1)-th level of conductors or pins of K or D[L+1] sets of conductors of (D[L+1]×$\Pi_{j=[1:L]}$ D[j]) where each of the (i−1)-th level of conductors selectively couple to each of the D[i] sets of conductors of the i-th level of conductors through I[i−1] number of switches for i=[1:L+1] thus there are a total of $\Sigma_{i=[1:L+1]}$ (I[i−1]×D[i]) number of switches in the conventional L-SN with N=$\Pi_{j=[1:L]}$ D[j]. The switching network, when limited to be a 1-SN or at the last intermediate stage or level in the conventional design, can have certain routing limits when at least one multicasting signal is logically grouped together with other signals from the first set of conductors in a skewed distribution.

Thus an L-level switching network (L-SN) of the conventional design has (L+2) levels of conductors and L levels of intermediate conductors of I[i] number of conductors consisting of D[i] sets of conductors for i=[1:L] and L≦1 to connect the 0-th level of pins or conductors of I[0] number of pins or conductors to the (L+1)-th level of pins or conductors of (D[L+1]×$\Pi_{j=[1:L]}$ D[j]) number of pins or conductors consisting of D[L+1] sets of pins or conductors through the L levels of intermediate conductors of the L-SN. A variable, $D_S[i]$, is defined as $D_S[i]$=(I[i−1]/I[i])×D[i] for i=[1:L+1]. A $D_S[i]$-tuple is $D_S[i]$ number of conductors of the (i−1)-th level of conductors with the characteristics that the $D_S[i]$-tuple selectively couple to one conductor, through $D_S[i]$ number of switches, in each of the D[i] sets of conductors of the i-th level of conductors in an L-SN for i=[1:L+1]; additionally, in the L-SN, the I[i−1] number of conductors of the (i−1)-th level can be organized into (I[i−1]/$D_S[i]$) number of $D_S[i]$-tuples for i=[1:L+1].

FIG. 1A illustrates a conventional L-SN. In FIG. 1A, M is denoted as I[0] and K is denoted as D[L+1]. Furthermore, N=$\Pi_{j=[1:L]}$ D[j] where L=1, I[0]=16, I[1]=16, I[2]=24, D[1]=4, D[2]=6, for i=[1:L+1] and $D_S[i]$=(I[i−1]/I[i])×D[i], there are (I[i−1]/$D_S[i]$) groups of $D_S[i]$ number of conductors of the I[i−1] number of conductors of the (i−1)-th level of conductors and each group (the (I[i−1]/$D_S[i]$) groups) of $D_S[i]$ number of conductors is denoted as a $D_S[i]$-tuple where each $D_S[i]$-tuple selectively couple to one conductor, through $D_S[i]$ number of switches, in each of the D[i] sets of conductors of the i-th level of conductors of I[i] number of conductors consisting of D[i] sets of conductors. It can be readily observed that the conventional L-SN example in FIG. 1A is drawn where each of the (I[i−1]/$D_S[i]$) groups of $D_S[i]$-tuples are consecutively labeled, e.g. first $D_S[i]$-tuple is [101:104], second $D_S[i]$-tuple is [105:108], third $D_S[i]$-tuple is [109:112], (I[i−1]/$D_S[i]$)-th $D_S[i]$-tuple is [113:116]; thus a $D_S[i]$-tuple can be considered as $D_S[i]$ number of conductors that can be consecutively labeled in an L-SN representation and a X-tuple is X number of consecutively labeled conductors in the L-SN. Consider that there are eight nets carrying signals in the I[0] number of conductors [101:116] of FIG. 1A where the first four nets (101, 102, 103, 104) are in the first $D_S[1]$-tuple, [101:104], and the next four nets (109, 110, 111, 112) are in the third $D_S[1]$-tuple, [109:112], where the eight nets are selectively connected to the conductors in each of the D[L+1] sets of the (L+1)-th level of conductors of D[L+1] sets of conductors of (D[L+1]×$\Pi_{j=[1:L]}$ D[j]) number of conductors of the 1-SN (where D[L+1]=6 in the example of FIG. 1A): Specifically, given that net 101 has the connection specification represented as [1, 2, 3, 4], indicating a specified connection through one conductor in each of the first, the second, the third and the fourth sets of the D[L+1] sets ([151:156]) of the (L+1)-th level of conductors of D[L+1] sets of conductors of (D[L+1]×$\Pi_{j=[1:L]}$ D[j]) number of conductors connecting the pins of [F1:FK], thus the connection specifications connects net 101 to one conductor in each of the four sets of conductors of [151:154] which are respectively connected to the pins of [F1:F4], through the intermediate conductors [121:136] and the switches of the 1-SN. Additionally, each of the three nets (102, 103, 104) in the first $D_S[1]$-tuple [101:104] has the same connection specification of [1] indicating connection to one conductor from 151 connecting respectively to F1 through the intermediate conductors [121: 136] and the switches of the 1-SN. The other four nets (109, 110, 111, 112) of the third $D_S[1]$-tuple, [109:112], where (109, 110, 111) has the connection specification of [2] which are to be selectively connected to the second set 152 of F2, with the remaining net 112 having the connection specification of [3], to be selectively coupled to the third set 153 of F3. Thus the eight nets are located within Y=2 number of $D_S[i]$-tuples (e.g. two $D_S[i]$-tuples [101:104] and [109:112]) and the number of source-conductors, SC, of the (i−1)-th level of conductors is equal to eight (the eight nets of ([101:104], [109:112]) where i=1 and the number of coupling-conductors, CC=Y×D[i]=8 of the i-th level of conductors (the eight conductors (121, 123, 125, 127, 129, 131, 133, 135)).

There are eleven connections to the pins of [F1:F4] of [F1:FK] (through [151:154] of [151:156]) to be made in order to completely connect or route the eight signals of the eight source-conductors using the 1-SN illustrated in FIG. 1A; there are at most eight coupling-conductors that can be selected from the D[1] sets of intermediate conductors of I[1] number of conductors: the eight coupling-conductors (121, 123, 125, 127, 129, 131, 133, 135) couple the eight source-conductors of the two $D_S[i]$-tuples [101:104], [109:112] through the circled switches of the 1-SN, which in turn can only connect at most ten of the eleven connection specifications through [151:154] to the pins of [F1:F4] using the switches of the 1-SN. Thus the netlist interconnection specifications of the eight nets above can not be routed using the particular 1-SN. If there is no multicasting signal (e.g. net 101 is a single-casting signal such as connection specification of [1], instead of connection specification [1, 2, 3, 4]), any routing specifications (with single-casting signals) using the conventional 1-SN illustrated in FIG. 1A would not be a problem.

FIG. 1B is a redraw of FIG. 1A in the style represented in the U.S. Pat. No. 6,975,139, U.S. Pat. No. 7,256,614 and U.S. Pat. No. 7,417,457 and FIG. 1C is another redrawn illustration of FIG. 1A.

Note that in the illustrations of the embodiment of FIG. 1A, the number of coupling-conductors, CC of the i-th level of conductors connecting to any given number of source-conductors, SC, of the (i−1)-th level of conductors through (D[i]× I[i−1]) number of switches of the L-SN is CC=(Y×D[i]) where Y is the number of $D_S[i]$-tuples of the (i−1)-th level of conductors the SC number of conductors are selected from.

BRIEF DESCRIPTION OF THE DRAWINGS

The objectives, features, and advantages of the present invention will be apparent from the following detailed description in which.

DETAILED DESCRIPTION

Figure 1A:
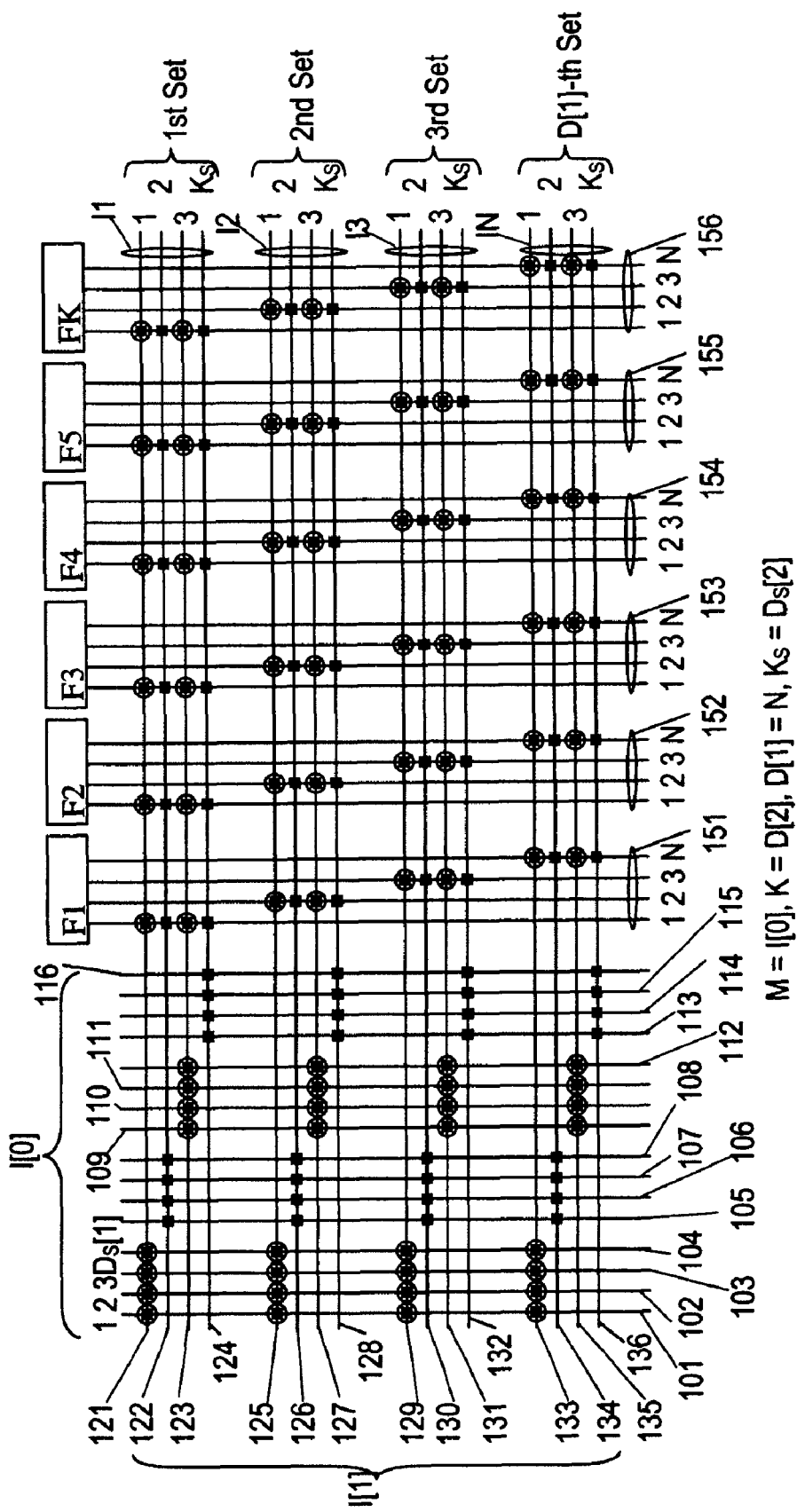
FIG. 1A illustrates a conventional one-stage switching network (1-SN) with M=I[0]=16, K=D[2]=6, N=D[1]=4, $N_S=D_S[1]$=4, $K_S=D_S[2]$=4 and (I[0]×D[1]+I[1]×D[2])=160 switches.
Figure 1B:
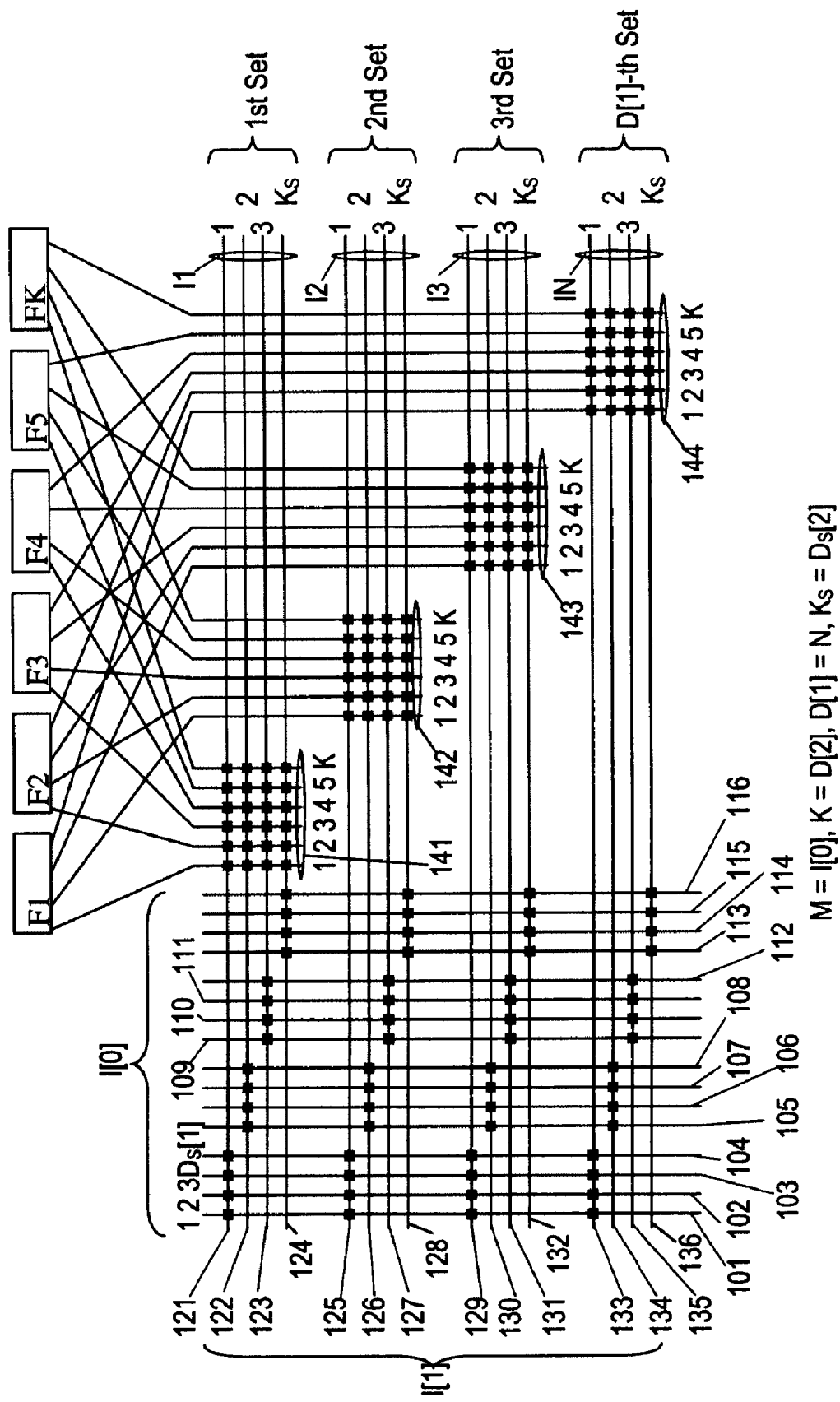
FIG. 1B is an equivalent redrawing of the embodiment of FIG. 1A.

A new L-levels permutable switching network (L-PSN) formulations, which has the similar constraints having the same number of switches and conductors coupling a first set of M or I[0] number of conductors or pins, through the L levels of intermediate conductors of I[i] number of conductors consisting of D[i] sets of conductors for i=[1:L], to connect to a second K or D[L+1] sets of conductors of (D[L+1]×$\Pi_{j=[1:L]}$ D[j]) number of conductors or pins where the I[i−1] number of conductors of the (i−1)-th level of conductors selectively couple to each of the D[i] sets of conductors of the i-th level of conductors through I[i−1] number of switches for i=[1:L+1] thus there are a total of $\Sigma_{i=[1:L+1]}$ (I[i−1]×D[i]) number of switches in the L-PSN and N=$\Pi_{j=[1:L]}$ D[j], are described in this application. The L-PSN can be applied to a wide range of applications, when used, either as a 1-PSN, or used hierarchically in multiple stages, as an L-PSN, to provide a large switch network that can be used in switching systems, routers, and programmable logic circuits. The permutable switching network is used to connect an O-th level of I[0] number of conductors or pins, through the switches and L level(s) of intermediate conductors of the L-PSN where each of the L level(s) of intermediate conductors has I[i] number of conductors consisting of D[i] sets of conductors for i=[1:L], to an (L+1)-th level of conductors of (D[L+1]×$\Pi_{j=[1:L]}$ D[j]) number of conductors or pins consisting of D[L+1] sets of conductors where N=$\Pi_{j=[1:L]}$ D[j] whereby the (N number of) conductors or pins in each of the D[L+1] sets are equivalent or interchangeable; for example, the conductors or pins in one of the D[L+1] sets are the inputs of a Look Up Table (LUT), a logic module or a switching network which are interchangeable or equivalent. The switch couplings for each two consecutive levels of conductors of the L-PSN can either be globally distributed or locally distributed following the L-PSN formulations. The permutable switching network disclosed herein provides enhanced connections or routability over the conventional design, including the handling multi-casting signals.

In the following descriptions, for purposes of explanation, numerous specific details are set forth in order to provide a thorough understanding of the present invention. It will be apparent to one skilled in the art that embodiments of the present invention may be practiced without these specific details. In other instances, well-known structures and circuits are shown in block diagram form in order to avoid unnecessarily obscuring the present invention. For purpose of description, unless otherwise specified, the terms program controlled switch and switch are interchangeable in the context of this description; the terms program configured logic cell, logic cell, cell, LUT, programmable logic cell are interchangeable in the context of this description; the terms conductor, pin, line are interchangeable in the context of this description; signal, net, signal net are interchangeable in the context of this description which generally refers to a conductor carrying signal from a source to destination(s); while port and conductors or a set of conductors are interchangeable in the context of this description where a port has a plurality of pins or conductors. Thus a net associated with a conductor of the 0-th level of conductors of M or I[0] number of conductors generally carries a signal which is to be selectively connected, through the L-PSN, to one or more conductors, each of which is selected from one of the set of the (L+1)-th level of conductors of K or D[L+1] sets of conductors of (D[L+1]×$\Pi_{j=[1:L]}$ D[j]) number of conductors. Thus it should be clear, for one skilled in the art, that the terms conductor, pin, line, signal, net are interchangeable depending on the context of this description. The notations [ ] and ( ) sometimes are used interchangeably to indicate one or more objects such as conductors or pins being grouped together. It should also be noted that the present invention describes embodiments which use program control means to set the states of switches utilized, this control means can be one time, such as fuse/anti-fuse technologies, or re-programmable, such as SRAM (which is volatile), FLASH (which is non-volatile), Ferro-electric (which is non-volatile), etc. Hence the present invention pertains to a variety of processes, including, but not limited to, static random access memory (SRAM), dynamic random access memory (DRAM), fuse/anti-fuse, erasable programmable read-only memory (EPROM), electrically erasable programmable read-only memory (EEPROM) such as FLASH, and Ferro-electric processes.

When a program controlled switch is used to interconnect one conductor to another conductor, a driver circuit may be coupled to the switch to improve the speed of the signal traversing those conductors; thus a switch can be comprised of a driver circuit. Additionally, if multiple conductors (signals) fan-in to a conductor through program controlled switches, it is possible to use a multiplexer (MUX) scheme, if desired, to either reduce loading on the conductor or to reduce circuit size, or both, depending on the process technology used. In the case where a MUX is used, the multiple switches are converted into a new switching mechanism where, the number of control states are the same as the number of switches; connectivity is enabled by choosing the particular state (corresponding to the switch when multiple switches were used) in connecting two conductors and the states are determined by program control; as an example, in a four to one MUX there are four states to control the selection of which one of the four inputs is connected to the one output hence each state corresponds to a respective switch which can be program controlled.

This application discloses a new L-level(s) (of intermediate conductors) permutable switching network (L-PSN) where an 0-th level of conductors having I[0] number of conductors or pins coupling through L levels of intermediate conductors where each of the i-th level of conductors having I[i] number of conductors consisting of D[i] sets of conductors for i=[1:L] with a total of $\Sigma_{j=[1:L+]}$ (I[j−1]×D[j]) number of switches of the L-PSN to the (L+1)-th level of conductors of I[L+1]=(D[L+1]×$\Pi_{j=[1:L]}$ D[j]) number of conductors consisting of D[L+1] sets of conductors.

The new L-PSN is formulated as follows:

PSN-(A): Each conductor of the I[i−1] number of conductors of the (i−1)-th level of conductors couples to one conductor in each of the D[i] sets of conductors of the i-th level of conductors of I[i] number of conductors consisting of D[i] sets of conductors through a switch for i=[1:L+1].

PSN-(B): The I[i−1] number of conductors of the (i−1)-th level of conductors couple to the conductors in each of the D[i] sets of conductors of the i-th level of conductors through I[i−1] number of switches, thus the I[i−1] number of conductors couple to the D[i] sets of conductors of the i-th level of conductors through (I[i−1]×D[i]) number of switches for i=[1:L+1].

PSN-(C): Any $D_S[i]$ number of conductors of (T×$D_S[i]$) number of conductors of the (i−1)-th level of conductors of I[i−1] number of conductors selectively couple to at least two conductors in at least one of the D[i] sets of conductors respectively having T number of conductors of the i-th level of conductors of I[i] number of conductors consisting of D[i] sets of conductors through a respective $D_S[i]$ number of switches, for an i selected from i=[1:L+1] and T>1.

An L-PSN can have either localized switch couplings between two consecutive level of conductors as specified by PSN-(C) when T is less than (I[i−1]/$D_S[i]$) or has global switch couplings between two consecutive level of conductors when T=(I[i−1]/$D_S[i]$) in the PSN-(C) formulations.

Another related application by the inventors, U.S. patent application Ser. No. 12/327,704, which has been assigned to the same assignee as the present application, based on the same L-PSN constraints of (L+2) levels of conductors with L levels of intermediate conductors described above, will describe another alternative L-PSN based on different distributions of switch couplings of conductors such as $D_S[i]$ number of conductors of an (i−1)-th level of conductors to conductors of an i-th level of conductors; the other application by the inventors has the same PSN-(A) and PSN-(B) formulations with PSN-(C) and PSN-(D) formulations different from the PSN-(C) formulations of this application. There are abroad arrays of L-PSNs which can be constructed based on the PSN-(A) through PSN-(C) formulations above. The conventional L-SN adheres to the PSN-(A) and PSN-(B) formulations and is different from the L-PSN in the PSN-(C) formulations.

Figure 2A:
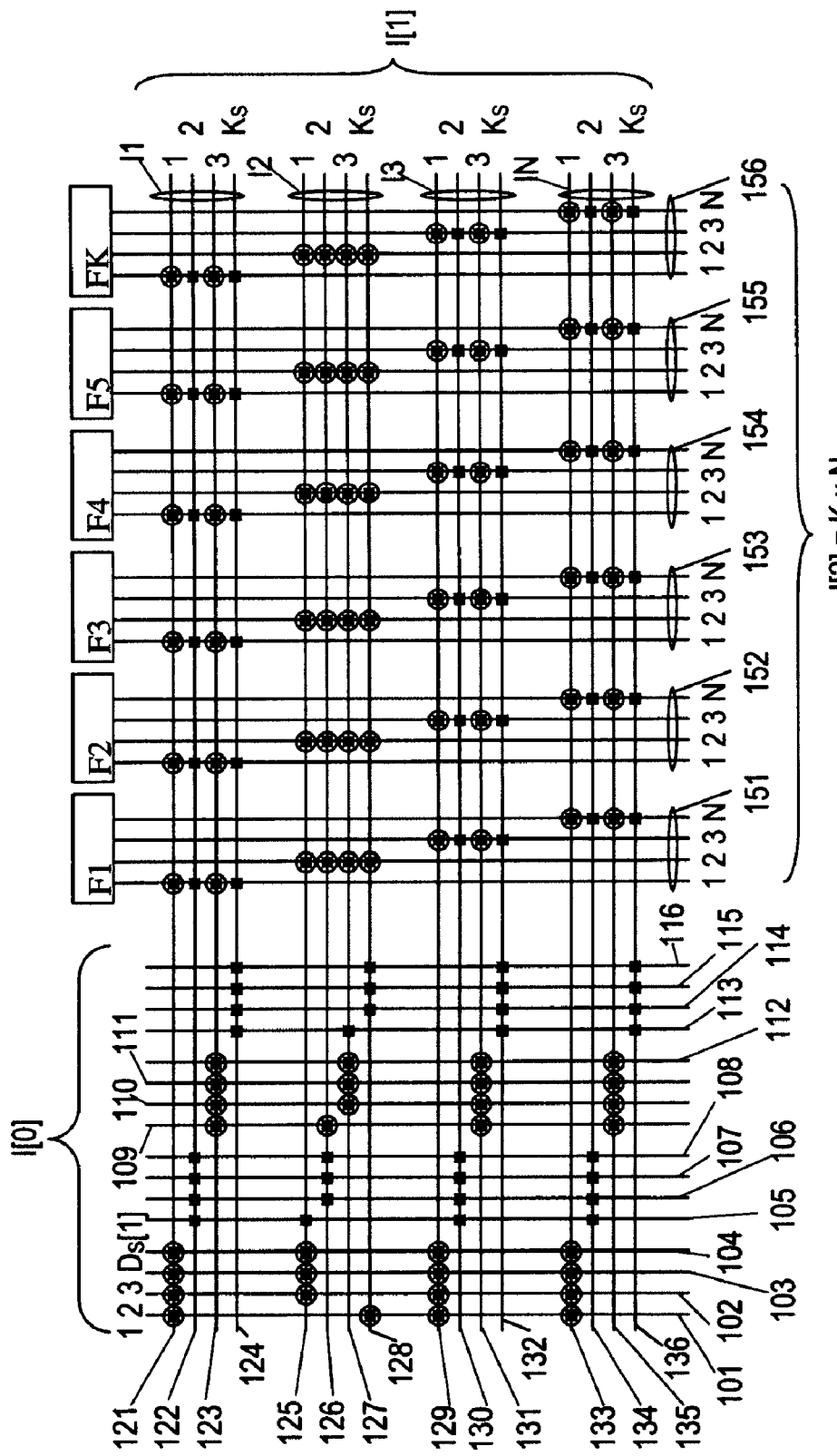
FIG. 2A illustrates one embodiment of the present invention of one-stage permutable switching network (1-PSN) having one circular (barrel) shift of switches coupling between the 0-th level of conductors of I[0] number of conductors and the first level of conductors of I[1] number of conductors consisting of D[1] sets of intermediate conductors with M=I[0]=16, I=I[1] 16, K=D[2] 6, N=D[1]=4 and (I[0]× D[1]+I[1]×D[2])=160 switches.
Figure 2B:
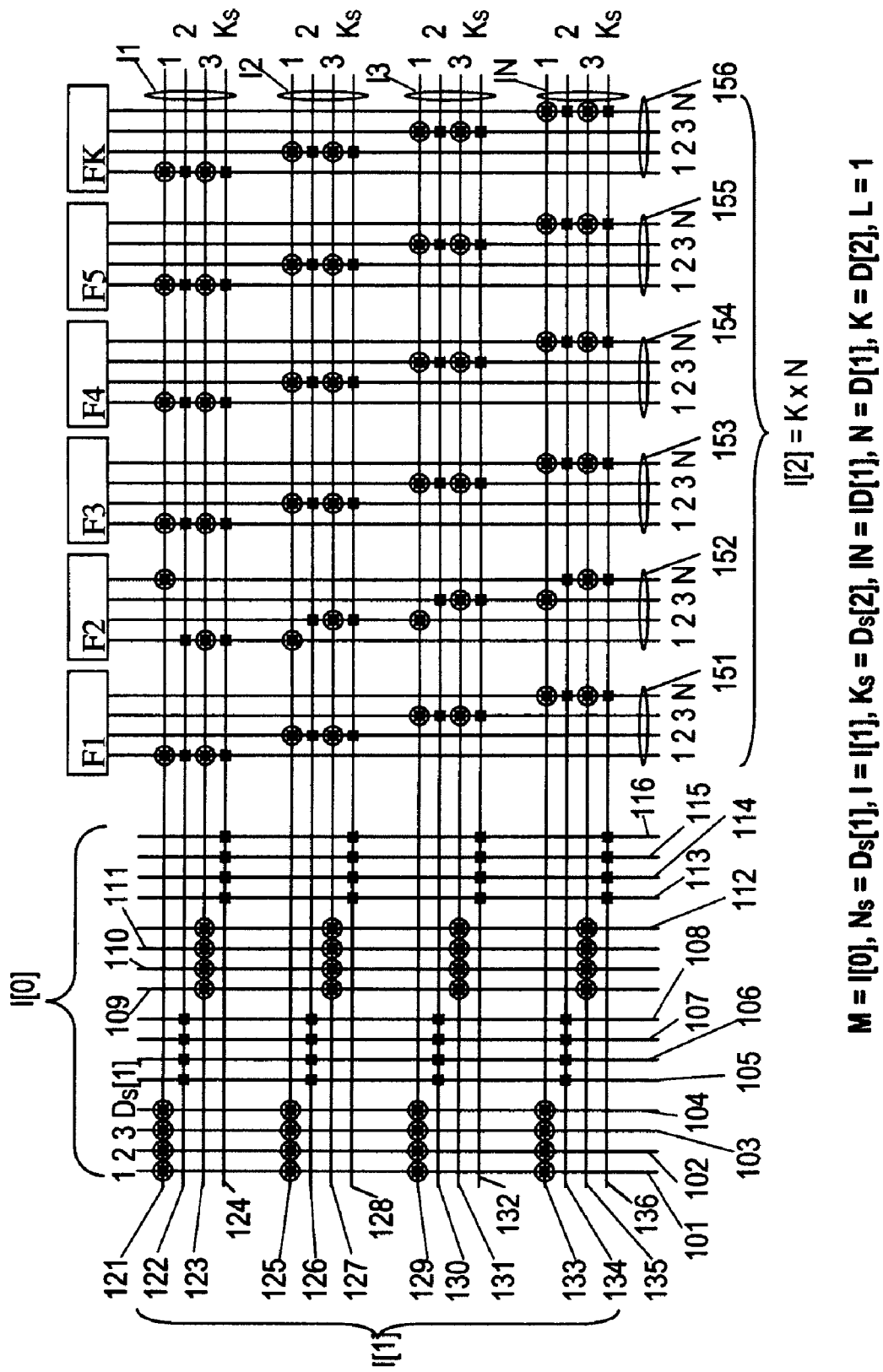
FIG. 2B illustrates one embodiment of a one-stage permutable switching network (1-PSN) having one circular (barrel) shift of switches coupling between the first level of conductors of I[1] number of conductors consisting of D[1] sets of intermediate conductors and the second level of conductors of I[2]=(K×N) number of conductors consisting of D[2]=K sets of conductors with M=I[0]=16, K=D[2]=6, N=D[1]=4, I=I [1]=16, I[2]=D[1]×D[2]=24 and (I[0]×D[1]+I[1]×D[2])=160 switches.

One of the simplest L-PSN is illustrated in the embodiment of a 1-PSN, respectively, of FIG. 2A and FIG. 2B, following the PSN-(A) through PSN-(C) formulations. Using the net connection specifications discussed in the conventional design illustrated in FIG. 1A above, in the embodiment of FIG. 2A with i=1, the netlist with eight nets has the connection specifications to pins of [F1, F2, F3 to FK] through [151:156] where the first net 101 has the pins connection specification [1, 2, 3, 4], each of the nets (102, 103, 104) has connection specification [1], each of the nets (109, 110, 111) has connection specification [2] and net 112 has connection specification [3]. The circles in FIG. 2A represents the possible switch couplings between the eight nets to the pins of the [F1, F2, F3 to FK] modules through the 1-PSN, by activating the switches indicated as black squares in FIG. 2A, the enhanced 1-PSN can route the eight nets according to specifications using the respective 1-PSN embodiment while in the case of conventional illustrations of FIG. 1A, the connection specifications would have been incomplete (thus un-routable using the 1-SN of FIG. 1A).

Specifically in FIG. 2A, net 101 with connection specifications [1, 2, 3, 4] is first connected to 121 through the first switch shown as a black square, then connecting to the first conductor of 151 connecting to a corresponding pin of F1 ([1] of [1, 2, 3, 4]), the first conductor of 152 connecting to a corresponding pin of F2 ([2] of [1, 2, 3, 4]), the first conductor of 154 connecting to a corresponding pin of F4 ([4] of [1, 2, 3, 4]) through the switches with black squares and the connection specification [3] of [1, 2, 3, 4] through the second conductor of 153 connecting to a corresponding pin of F3 by selecting intermediate conductor 128 through two switches shown as black squares as illustrated in FIG. 2A. There are ten coupling-conductors which can be selected from the D[1] sets of intermediate conductors of I[1] number of conductors (coupling to the eight source-conductors [101:104], [109:112]) of which selection of nine coupling-conductors are sufficient to connect to all eleven required connections to the pins of [F1:F4] through [151:154] to route the signals of the connection specifications using the 1-PSN. Similarly, with the same eight nets of the netlist connection specifications of examples above, by activating the switches shown as black squares in the 1-PSN illustrated in FIG. 2B with i=2 for PSN-(C), all eight nets of the netlist can also be routed using the coupling switches indicated by the black squares.

Instead of the more restrictive $D_S[i]$-tuple definition used in the conventional design discussed above, in the following disclosures, $D_S[i]$-tuple may be loosely used as $D_S[i]$ number of consecutively labeled conductors where the I[i−1] number of conductors can be divided into (I[i−1]/$D_S[i]$) groups of $D_S[i]$-tuples where each of the (I[i−1]/$D_S[i]$) groups of $D_S[i]$-tuples selectively couple to one respective conductor of at least one of the D[i] sets of conductors. The coupling relations between source-conductors, SC, and coupling-conductors, CC, in the type of L-PSN illustrated in the embodiments of FIG. 2A and FIG. 2B can be generalized as follows: Given SC, the number of source-conductors, selected at least one conductor from each of Y number of $D_S[i]$-tuples, the number of coupling-conductors CC ranges between D[i] and (D[i]+1) for Y=1; and for Y>1, CC ranges between (Y×D[i]−1) and {Y×(D[i]−1)+[Y2 where Y2=(Y×2) if (Y×2)≦(I[i]/D[i]) else Y2=(I[i]/D[i])]} with the maximum number being limited at I[i] for an i selected from i=[1:L+1] in the L-PSN.

It is readily determined that for SC≦$D_S[i]$ and Y=1, i=1, where SC number of source-conductors are selected from any one of the $D_S[i]$-tuples: [101:104], [105:108], [109:112], [113:116] of FIG. 2A, CC ranges between D[i] and (D[i]+1).

Thus the simplest L-PSN illustrations of this application has the following minimum properties or characteristics:

PSN-(1): Any SC=$D_S[i]$ number of source-conductors of the (i−1)-th level of conductors of I[i−1] number of conductors couple to at least CC=(D[i]+1) number of coupling-conductors of the i-th level of conductors of D[i] sets of conductors of I[i] number of conductors for at least one i selected from i=[1:L+1].

Using the embodiment of FIG. 2A as illustrations, for any SC where SC number of source-conductors are selected from more than one $D_S[i]$-tuples, e.g. Y>1, CC ranges between (Y×D[i]−1) and {Y×(D[i]−1)+[Y2 where Y2=(Y×2) if (Y×2)≦(I[i]/D[i]) else Y2=(I[i]/D[i])]} with the maximum number being limited at I[i] for an i selected from i=[1:L+1] in the L-PSN: for SC=2, with (104, 105) as the two source-conductors where Y=2, there are (Y×D[i]−1)=7 number of coupling-conductors (121, 122, 125, 129, 130, 133, 134); for SC=2, with (101,105) as the two source-conductors where Y=2, there are eight number of coupling-conductors (121, 122, 125, 128, 129, 130, 133, 134); for SC=3, with (101, 105, 106) as the three source-conductors where Y=2, there are nine number of coupling-conductors (121, 122, 125, 126, 128, 129, 130, 133, 134); for SC=8, with [101:105] and [109:112] as the eight source-conductors where Y=2, there are {Y×(D[i]−1)+[Y2 where Y2=(Y×2) if (Y×2)≦(I[i]/D[i]) else Y2=(I[i]/D[i])]}=(2×3)+(2×2)=10 number of coupling-conductors (121, 123, 125, 126, 127, 128, 129, 131, 133, 135), thus completing the CC range from seven to ten.

Figure 3A:
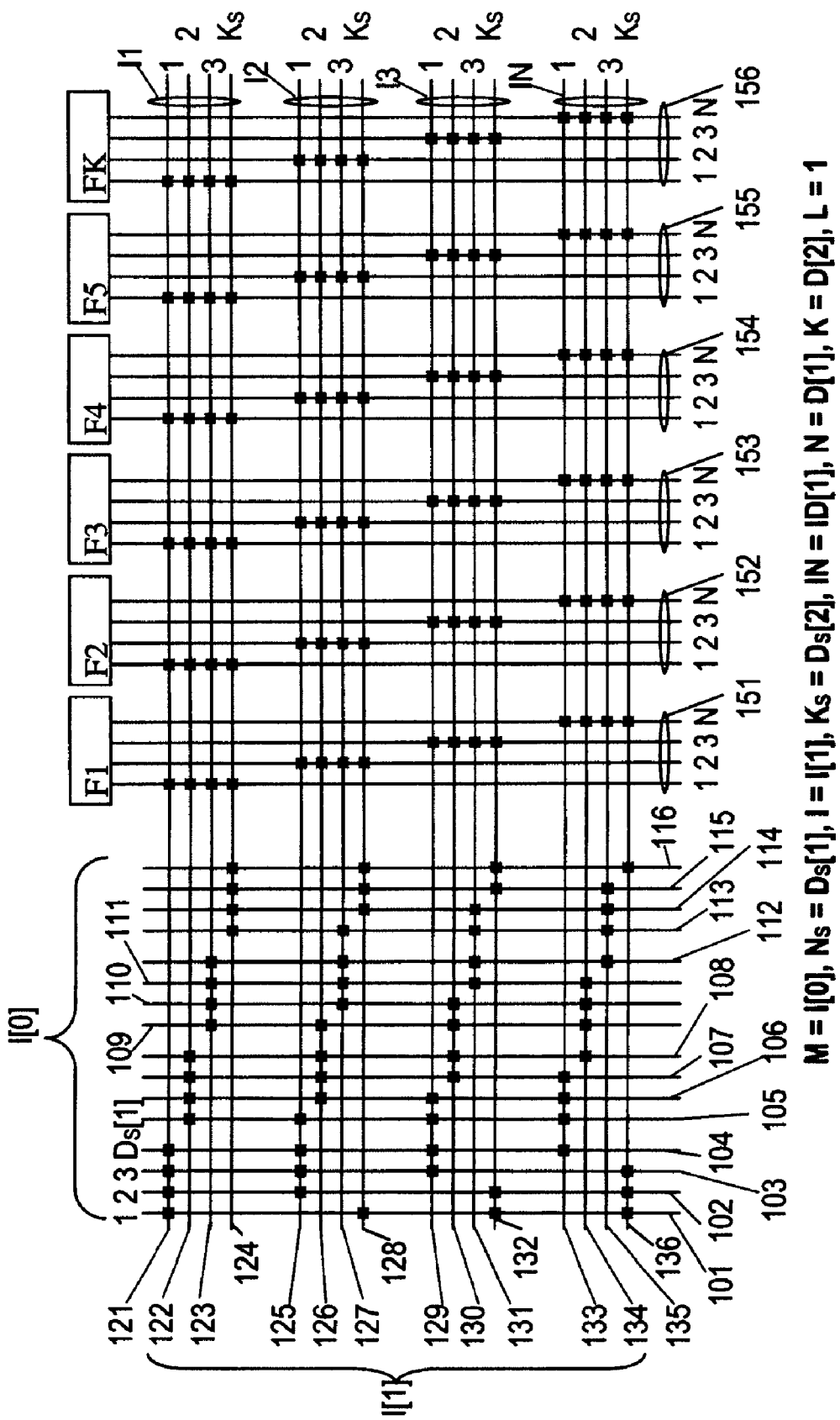
FIG. 3A illustrates one embodiment of a one-stage permutable switching network (1-PSN) with (D[1]−1) number of circular (barrel) shifts of switches coupling between the 0-th level of conductors of I[0] number of conductors and the first level of conductors of I[1] number of conductors consisting of D[1] sets of intermediate conductors with M=I[0]=16, I=I[1]=16, K=D[2]=6, N=D[1]=4 and I[0]×D[1]+I[1]× D[2])=160 switches.
Figure 3B:
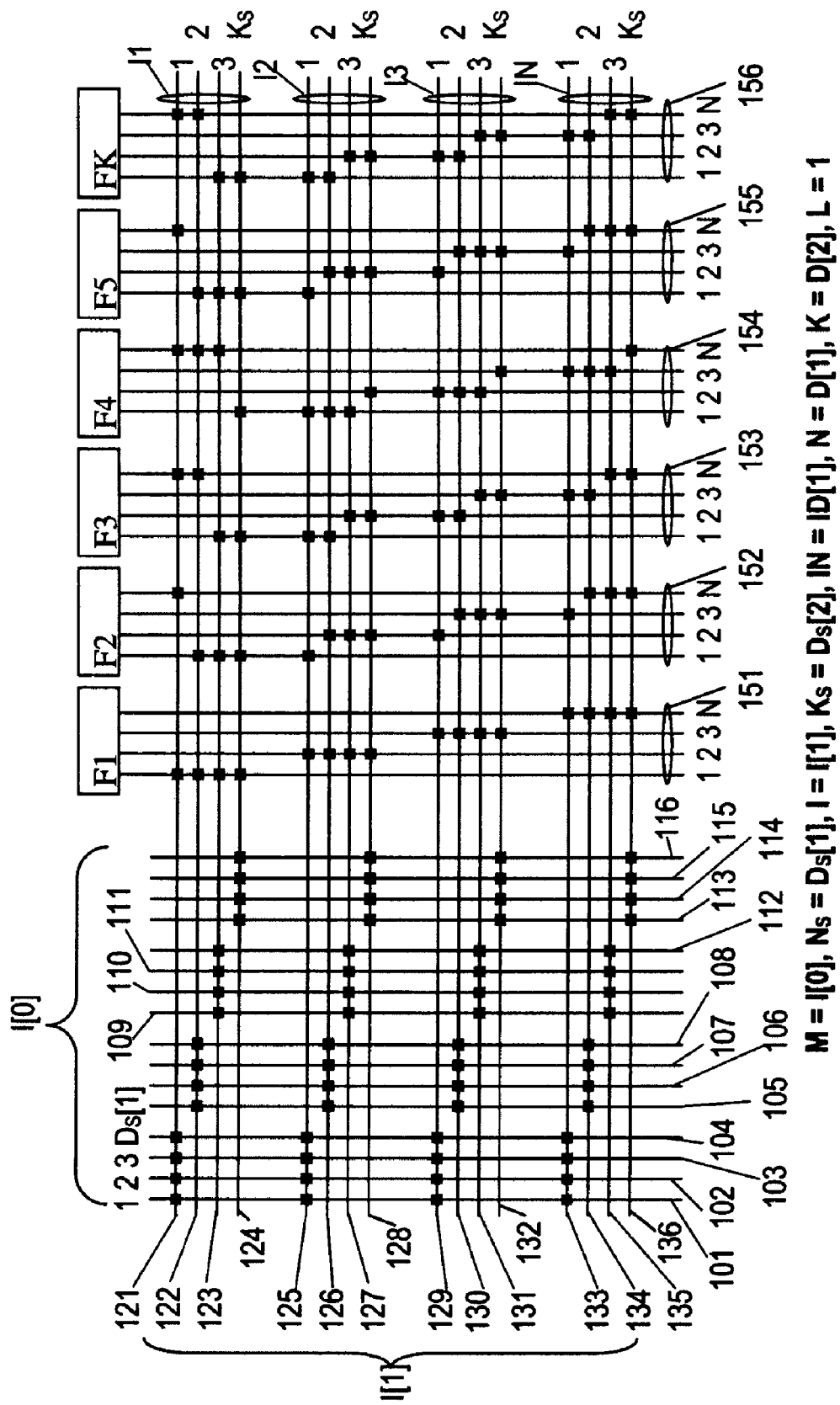
FIG. 3B illustrates one embodiment of a one-stage permutable switching network (1-PSN) with (D[2]−1) number of circular (barrel) shifts of switches coupling between the first level of conductors of I[1] number of conductors consisting of D[1] sets of intermediate conductors and the second level of conductors of I[2]=(D[2]×D[1]) number of conductors consisting of D[2]=K sets of conductors with M=I[0]=16, K=D [2]=6, N=D[1]=4, I=I[1]=16, I[2]=D[1]×D[2]=24 and (I[0]× D[1]+I[1]×D[2])=160 switches.

The embodiments of FIG. 3A and FIG. 3B are illustrations of L-PSN extensions of FIG. 2A and FIG. 2B where for Y=1, the SC number of source-conductors ranges between one and $D_S[i]$ and the number of coupling-conductors, CC, ranges between D[i] and (D[i]+Z); and for Y>1, with SC number of source-conductors selected from the Y number of $D_S[i]$-tuples, the number of coupling-conductors, CC, ranges between (Y×D[i]−Z) and {Y×(D[i]−Z)+[(Z×Y2) where Y2=(Y×2) if (Y×2)≦(I[i]/D[i]), else Y2=(I[i]/D[i])]} with the maximum limit of I[i] where Z is the number of circularly (barrel) shifted sets of the I[i] number of conductors consisting of D[i] sets of conductors coupling the I[i−1] number of conductors of the (i−1)-th level of conductors; and respectively, Z=(D[i]−1)=3 for i=1 in FIG. 3A and Z=(D[i]−1)=5 for i=2 in FIG. 3B.

The number of coupling-conductors, CC, in the generalized descriptions of the embodiment of FIG. 3A, where $D_S[i]$=D[i], can be expressed as a simple relation when the SC number of source-conductors are consecutive, namely when they are grouped as a SC-tuple (as SC number of consecutively labeled conductors) and the number of coupling-conductors can be generally stated as CC=(SC+$D_S$[i]−1+(D[i]−$D_S$[i])×2) with the maximum limit at I[i]. As an example, for i=1, Y=1 in FIG. 3A, SC ranges between one and D[i] and CC; for SC=1, CC=(SC+D[i]−1) which is equal to D[i]; for SC=D[i], CC=(SC+D[i]−1)=(D[1]+D[1]−1)=7 which is equal to (D[i]+Z)=(D[1]+D[1]−1)=7 of the alternative relations discussed earlier. Similarly, for i=1, Y>1 in FIG. 3A, pick any six source-conductors such as the conductors of [104:109], thus Y=3, there are nine coupling-conductors in the embodiment of FIG. 3A: (121, 122, 123) of I1, (125, 126) of I2, (129, 130) of I3 and (133, 134) of I4, a total of CC=(SC+D[i]−1)=(6+4−1)=9 coupling conductors, and alternatively, CC=(Y×D[i]−Z)=(3×4)−3=9 which is the lower range formulation for Y>1 in the earlier discussion thus minimum CC=(SC+D[i]−1) is the minimum relations for an SC-tuple for the type of L-PSN of FIG. 3A.

The L-PSN illustrated in the embodiments of FIG. 3A through FIG. 3B has enhanced coupling-conductors properties compared with the PSN-(1) properties. More specifically, in the embodiment of FIG. 3A, for i=1 where D[i]=$D_S$[i], the minimum number of coupling-conductors for any SC is CC=(SC+D[i]−1), limited at maximum CC=I[i] (for SC=13). In the embodiment of FIG. 3B, for i=2, and Y>1 where D[i]>$D_S$[i], the minimum number of coupling-conductors for any SC is CC ranges between (Y×D[i]−D[i]+1)=(6Y−5) and {(Y+Y2×(D[i]−1))=(Y+5Y2) where Y2=(Y×2) if (Y×2)≦(I[i]/D[i]), else Y2=(I[i]/D[i])]} with the maximum limit of I[i] for Y ranges between one and (I[i−1]/$D_S$[i]) which is generally greater than or equal to (SC+D[i]−1). Thus an L-PSN can have a different switch coupling patterns between two consecutive levels of conductors with alternative enhanced coupling-conductors properties:

PSN-(2): Any SC number of source-conductors of the (i−1)-th level of conductors of I[i−1] number of conductors couple to CC≧(SC+D[i]−1) number of coupling-conductors and maximally CC=I[i] of the i-th level of conductors of the D[i] sets of conductors of I[i] number of conductors for at least one i selected from i=[1:L+1].

An L-PSN in accordance to the PSN-(A) through PSN-(B) formulations with either the properties of PSN-(1) or PSN-(2) has generally increased number of coupling-conductors, CC, connecting to the source-conductors, SC, of two consecutive levels of conductors compared with a corresponding conventional L-SN; and as illustrated in FIG. 2A through FIG. 3B, with improved or enhanced routability when there are skewed signal distributions with multicasting signal(s), compared with a corresponding L-SN of the conventional design.

The various illustrated L-PSNs of FIG. 2A through FIG. 3B follows the formulations of PSN-(A) through PSN-(C) with either PSN-(1) or PSN-(2) properties. The embodiments of FIG. 4A through FIG. 4C illustrates an L-PSN for L=2 with the coupling patterns in the embodiments of FIG. 4A (for i=1) and FIG. 4B (for i=2) in the style similar to the 1-PSN illustrated in FIG. 3A (where i=1=L).

Figure 4A:
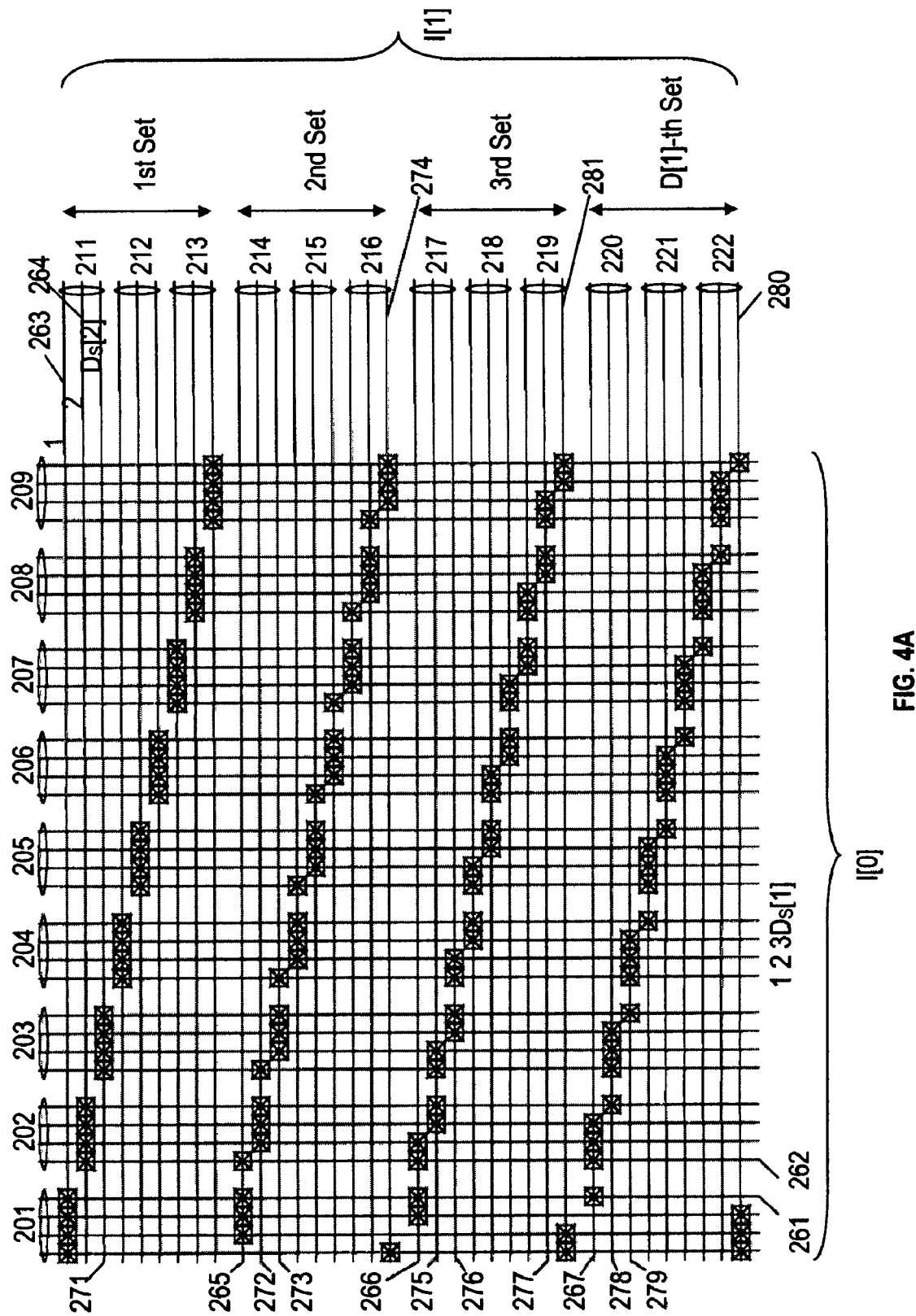
FIG. 4A illustrates one embodiment of the first two levels of conductors of a 2-PSN with (D[1]−1) number of circular (barrel) shifts with M represented by I[0] with I[0]=I[1]=36, N=D[1]×D[2]=12, D[1]=4, $D_S[1]$=4, D[2]=3, $D_S[2]$=3 and I[0]×D[1])=144 number of switches coupling globally between the 0-th level of conductors of I[0] number of conductors, and the first level of conductors of I[1] number of conductors consisting of D[1] sets of intermediate conductors.

The couplings between I[0]=[201:209] and I[1]=[211:222] of FIG. 4A has similar CC to SC switch coupling relations illustrated in the discussions of FIG. 3A and has the properties of PSN-(2) globally of the two consecutive levels of conductors, where i=1, I[0] number of conductors of the 0-th level of conductors and I[1] number of conductors of the 1st level of conductors.

Figure 4B:
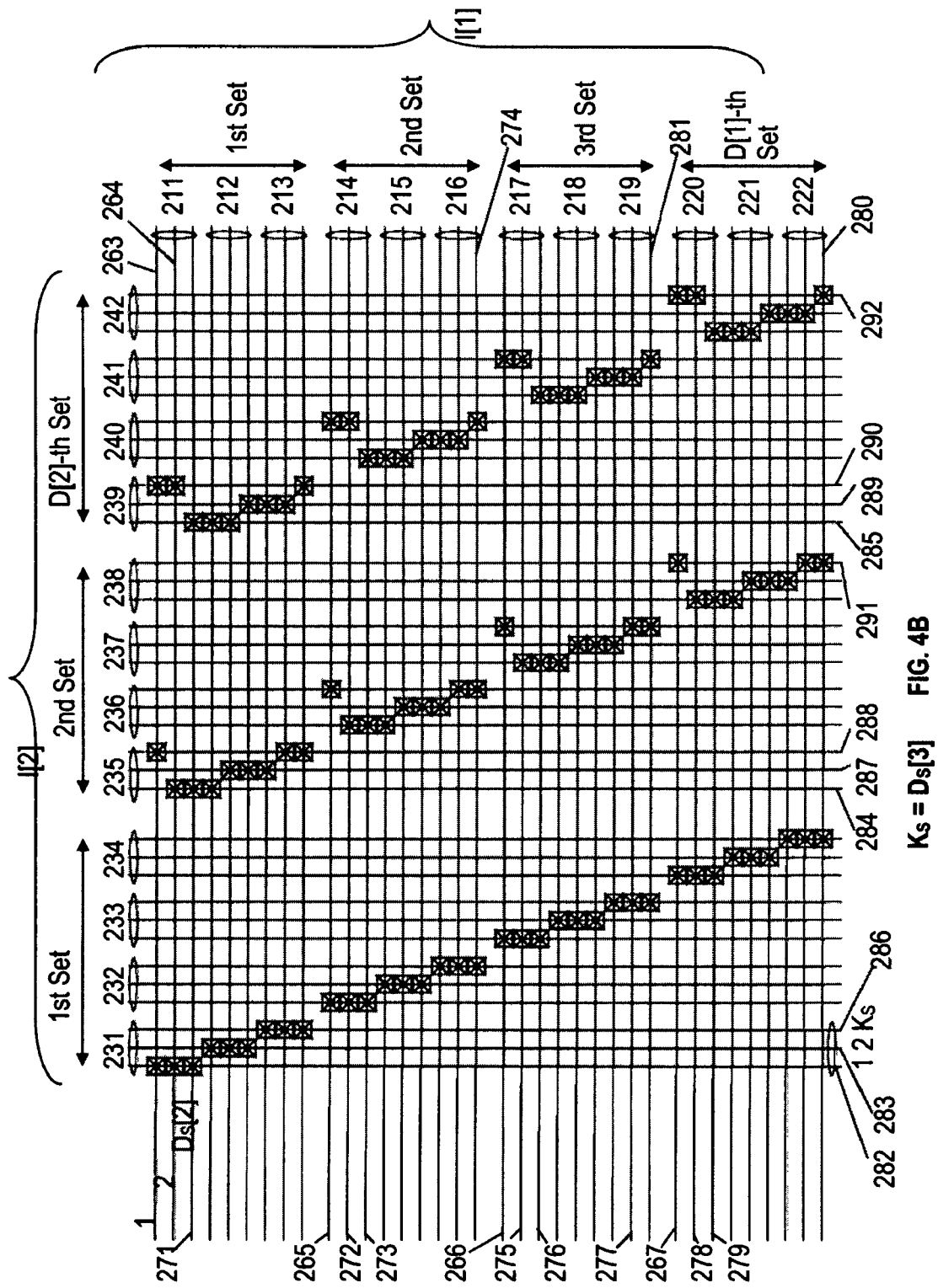
FIG. 4B illustrates one embodiment of another two levels of conductors of the 2-PSN of FIG. 4A with D[1]=4 sets of local couplings of (D[2]−1) number of circular (barrel) shifts by dividing I[1]=36 into D[1] sets of (I[2]/D[1]=9) conductors, coupling to (D[2]×$D_S[3]$)=9 conductors of the I[2]=36 conductors, with (I[1]×D[2])=108 number of switches coupling between the first level of conductors of I[1] number of conductors consisting of D[1] sets of intermediate conductors and the second level of conductors of I[2] number of conductors consisting of D[2] sets of intermediate conductors.
Figure 5A:
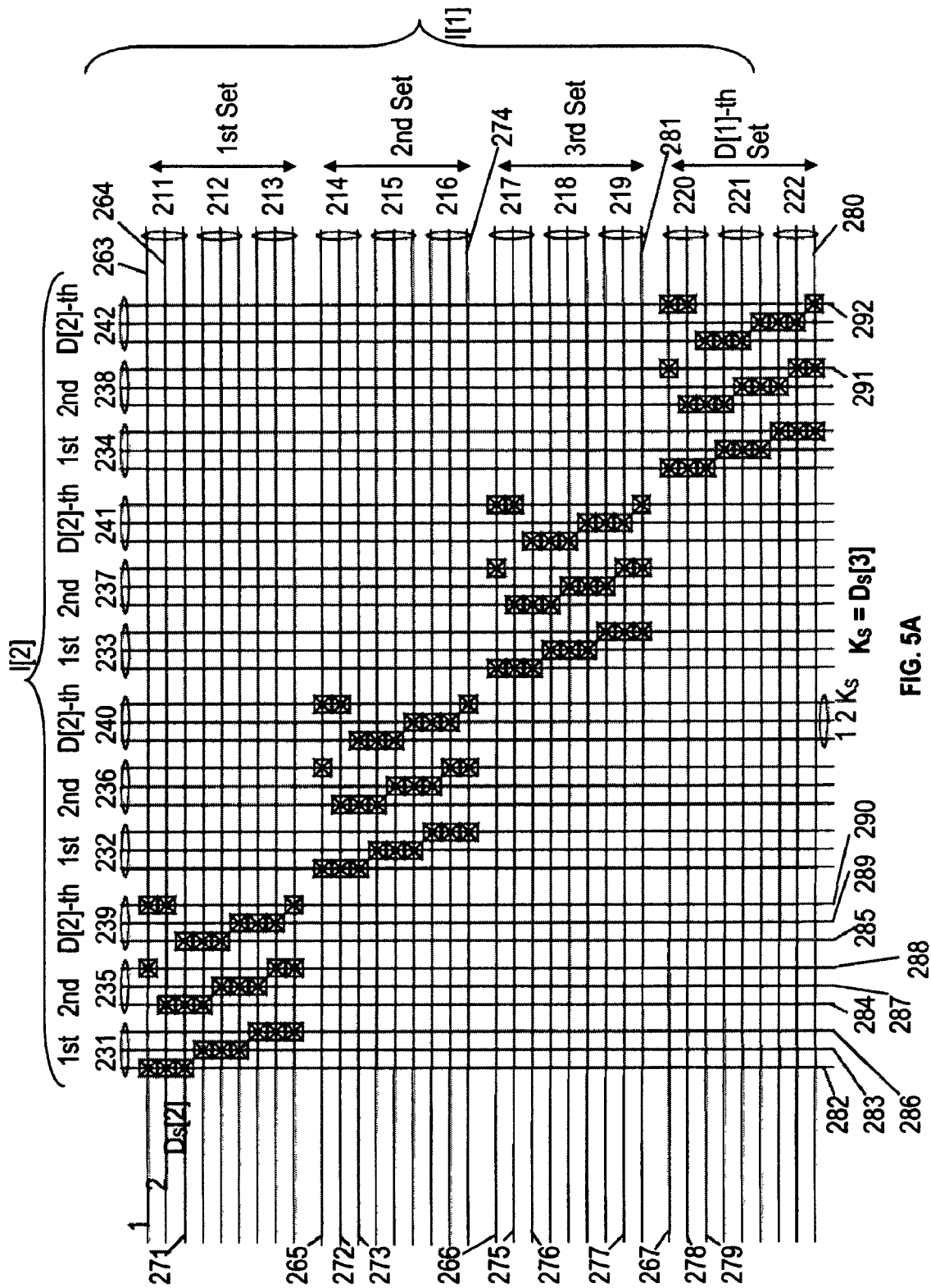
FIG. 5A illustrates a re-draw of the embodiment of FIG. 4B.

The couplings illustrated in FIG. 4B, on the other hand, has similar CC to SC switch coupling relations illustrated in the discussions of FIG. 3A and has the properties of PSN-(2) for each localized couplings between a subset of conductors of an (i−1)-th level of conductors of I[i−1] number of conductors and a subset of conductors of an i-th level of conductors of I[i] number of conductors. For example, in FIG. 4B where i=2, there are D[1]=4 sets of couplings where each couplings has (T×$D_S$[i])=($D_S$[3]×$D_S$[2])=(3×3)=9 number of conductors of the (i−1)-th level of conductors consisting of (I[1]/D[1])=9 conductors of the first level of conductors of I[1] number of conductors, [211:213], selectively couple to (T×D[i])=($D_S$[3]×D[2])=(3×3)=9 number of conductors of the i-th level of conductors consisted of one $D_S$[3]-tuple in each of the D[2] sets of conductors of I[2] number of conductors, (231, 235, 239). In the localized coupling example illustrated in the embodiment of FIG. 4B, SC ranges from one to (T×$D_S$[i]) thus the minimum number of CC≧(SC+D[i]−1) with maximum CC=(T×D[i]) since the source-conductors are limited to be [211:213] and the coupling-conductors are limited to be (231, 235, 239). Similarly, in FIG. 4B, (T×$D_S$[i]) number of conductors of the (i−1)-th level are conductors [214:216] and (T×D[i]) number of conductors of the i-th level are conductors (232, 236, 240), (T×$D_S$[i]) number of conductors of the (i−1)-th level are conductors [217:219] and (T×D[i]) number of conductors of the i-th level are conductors (233, 237, 241), (T×$D_S$[i]) number of conductors of the (i−1)-th level are conductors [220:222] and (T×D[i]) number of conductors of the i-th level are conductors (234, 238, 242) for the other D[1] sets of localized couplings between two consecutive levels of conductors. FIG. 5A is a redraw of FIG. 4B illustrating four copies of localized couplings between two levels of conductors. The global level of switch couplings of an L-PSN are illustrated in FIG. 4A for an i=1 selected from i=[1:L+1] while the localized switch couplings of an L-PSN are illustrated in FIG. 4B and FIG. 5A for an i=2 selected from i=[1:L+1] with the PSN-(C) formulations.

Figure 4C:
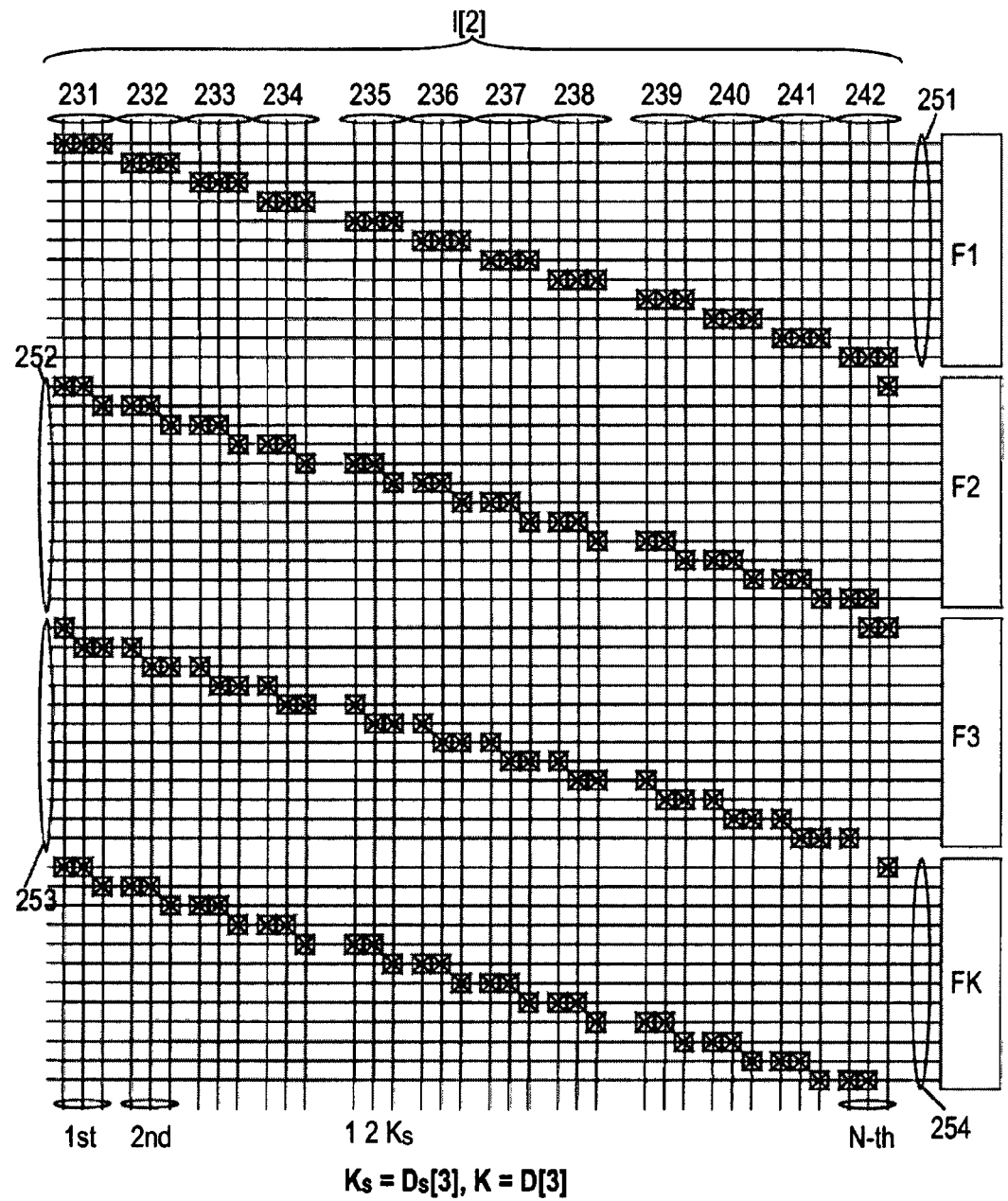
FIG. 4C illustrates one embodiment of the last two levels of conductors of the 2-PSN of FIG. 4A and FIG. 4B with (D[3]− 1) number of circular (barrel) shifts with D[3]=K=4 and (I[2]×D[3])=144 number of switches coupling globally between the second level of conductors of I[2] number of conductors consisting of D[2] sets of intermediate conductors and the third level of conductors of I[3]=(D[3]×D[2]×D[1]) number of conductors consisting of D[3] sets of conductors.

The embodiment illustrated in FIG. 4C has similar global couplings between I[2]=[231:242] and I[3]=[251:254] as the couplings between I[0] and I[1] illustrated in FIG. 4A with the last two levels of conductors of the 2-PSN of FIG. 4A, FIG. 4B and FIG. 4C. The switch couplings of the last two levels of conductors can also be localized to have replicable compact representations. FIG. 5C illustrates D[2]=3 sets of replicable local couplings for i=3: the first set with (T×$D_S$[i]) number of conductors [231:234] of I[2] and (T×D[i]) number of conductors [251:254] of I[3] which is the first T=(I[2]/D[2]/$D_S$[3])=4 conductors in each of the D[3] sets of conductors, the second set with (T×$D_S$[i]) number of conductors [235:238] of I[2] and (T×D[i]) number of conductors [251:254] of I[3] which is the second T=4 conductors in each of the D[3] sets of conductors and the D[2]-th set with (T×D$_S$[i]) number of conductors [239:242] of I[2] and (T×D[i]) number of conductors [251:254] which is the last T=4 conductors in each of the D[3] sets of conductors; each of the couplings thus has (T×D$_S$[i]) number of conductors of I[i−1] with 12 conductors and (T×D[i]) number of conductors of I[i] with 16 conductors with D[i]=4 and D$_S$[i]=3 with any SC=D$_S$[i] number of conductors coupling to a minimum CC=7 coupling-conductors which is at least equal to the PSN-(2) properties (e.g. CC≧(SC+D[i]−1)=6).

The circularly (barrel) shifted switch coupling patterns illustrated in FIG. 4A is global crossing the (I[0]/D$_S$[1])=9 number of D$_S$[1]-tuples [201:209] while the switch coupling patterns illustrated in FIG. 4B is localized compared with the switch coupling patterns of FIG. 4A. The schemes illustrated in FIG. 4A has larger minimum CC values compared with the schemes illustrated in FIG. 4B while the schemes illustrated in FIG. 4B allows for replicated or multiple localized representations which can reduce engineering complexities, especially in handling very large size L-PSNs by dividing up the problem size. It is apparent that the schemes illustrated in FIG. 4B allow localized groups of (subsets of) conductors of two levels of conductors of an L-PSN as long as the PSN-(A) through PSN-(C) formulations are adhered to for the switch couplings between those subsets of conductors with at least the PSN-(1) or PSN-(2) properties or characteristics.

Figure 5B:
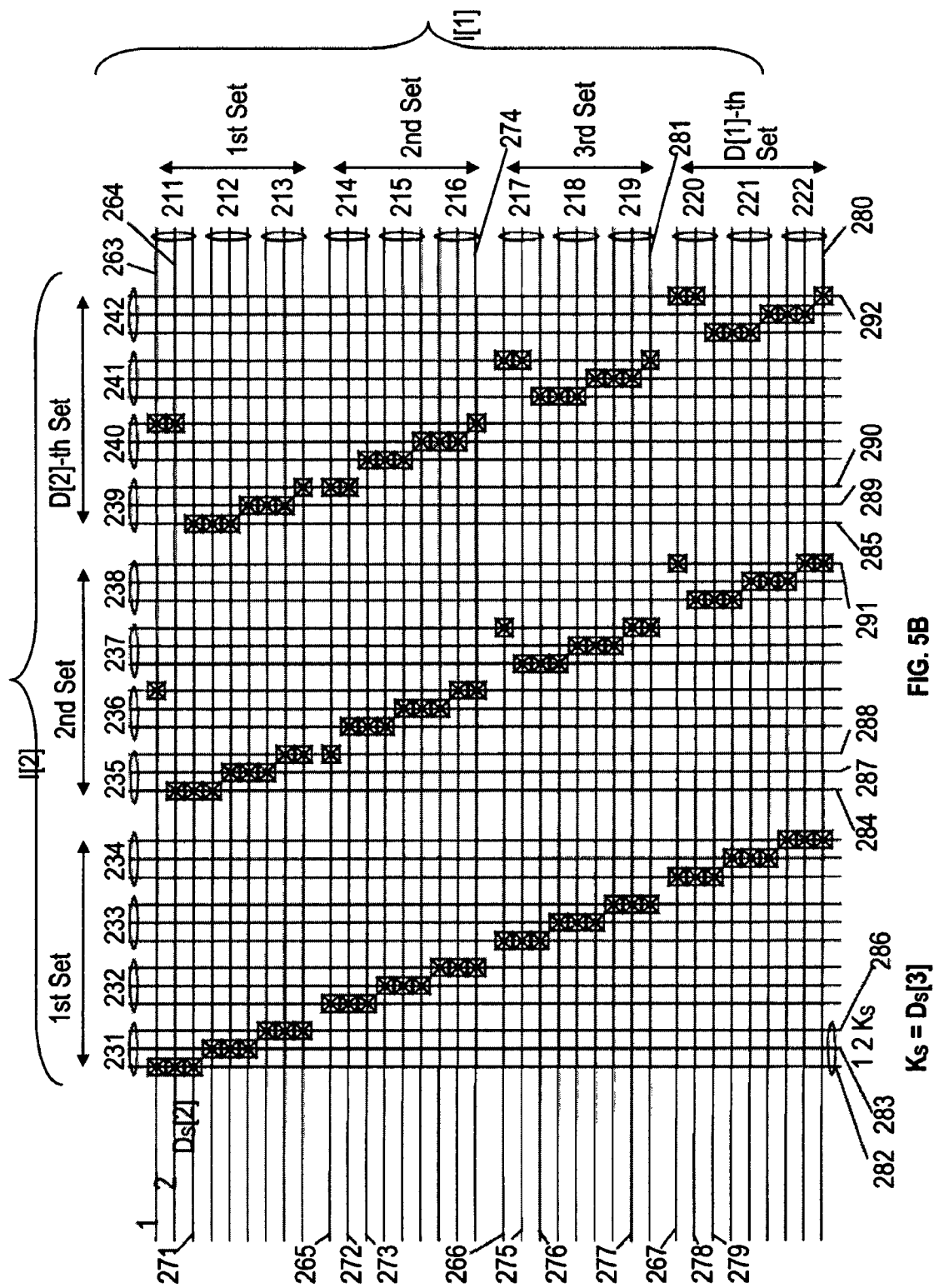
FIG. 5B illustrates an alternative embodiment of localized groupings of switch couplings between subsets of conductors of two consecutive levels of conductors with varying sizes of the embodiment of FIG. 4B.
Figure 5C:
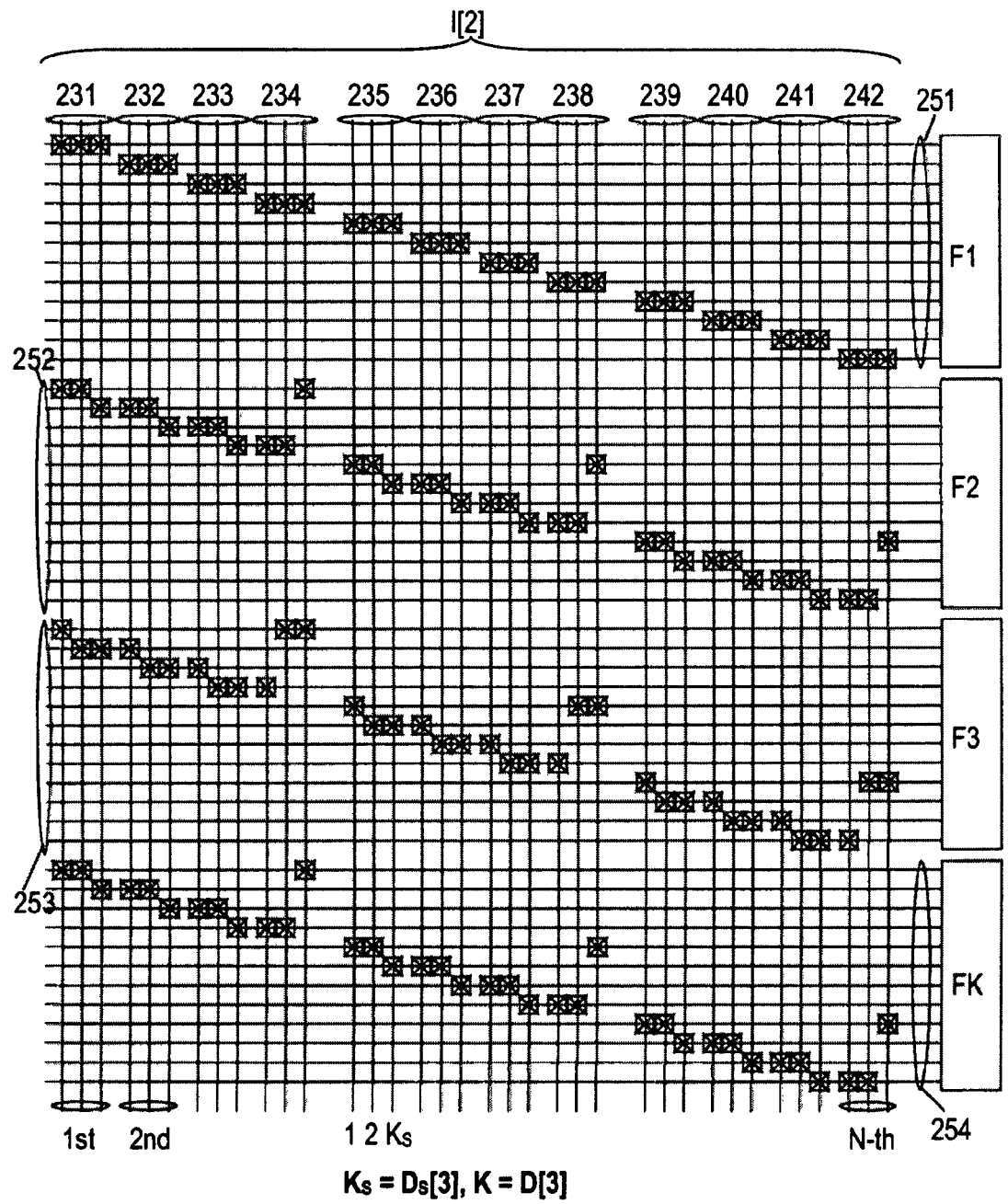
FIG. 5C illustrates one embodiment of localized groupings of switch couplings between subsets of conductors of two consecutive levels of conductors of the embodiment of FIG. 4C.

The embodiment of FIG. 5B illustrates alternative schemes of and L-PSN for i=2 where localized groupings of switch couplings between subsets of conductors of two consecutive levels of conductors have varying sizes: the first subset of (T×D$_S$[i])=18 number of conductors of I[i−1] are the 18 number of conductors [211:216] selectively couple to (T×D[i])=18 number of conductors (231, 232, 235, 236, 239, 240) for T=6 or 2D[3]; the next subset of (T×D$_S$[i])=9 number of conductors of I[i−1] are the 9 number of conductors [217:219] selectively couple to (T×D[i])=9 number of conductors (233, 237, 241) for T=3 or D[3]; and the last subset of (T×D$_S$[i])=9 number of conductors of I[i−1] are the 9 number of conductors [220:212] selectively couple to (T×D[i])=9 number of conductors (234, 238, 242) for T=3 or D[3] where the last two subsets of localized switch couplings are the same as those illustrated in the embodiment of FIG. 4B.

Thus an L-PSN has at least (T×D$_S$[i]) number of conductors of the I[i−1] number of conductors of the (i−1)-th level of conductors which are selectively coupled to T number of conductors in each of the D[i] sets of conductors of the i-th level of conductors for T>1 through (T×D$_S$[i]×D[i]) number of switches of the (I[i−1]×D[i]) number of switches of the L-PSN for at least an i selected from i=[1:L+1] where the switch couplings of those two subsets of conductors has generally increasing number of couplings-conductors, CC, in connection with a given number of source-conductors, SC, with at least the PSN-(1) or PSN-(2) properties or characteristics. There can be many alternative schemes of groupings of subsets of conductors different from the particular illustrations of FIG. 4B, FIG. 5B and FIG. 5C as long as the localized switch couplings follow the PSN-(A) through PSN-(C) formulations.

The generalized L-PSN formulations illustrated so far always refers to I[i−1] number of switches coupling the conductors of an (i−1)-th level of conductors of I[i−1] number of conductors to each of the D[i] sets of conductors of the i-th level of conductors of I[i] number of conductors consisting of D[i] sets of conductors where a subset of conductors of the (i−1)-level of conductors coupling a subset of conductors of the i-th level of conductors prescribed by the formulations of PSN-(A) and PSN-(C) and as a corollary, has at least the properties of PSN-(1) for at least one i selected from i=[1:L+1]. An L-PSN can have many variations and the decisions to design a specific implementation of the L-PSN is generally based on the specific design or engineering objectives such as size, speed and ease of software to handle routing, etc.

Without any loss of generality, it is only necessary to illustrate the switch couplings between two consecutive levels of conductors following the PSN-(A) through PSN-(C) formulations with at least the PSN-(1) or PSN-(2) properties for a particular i selected from i=[1:L+1] in an L-PSN, where, in accordance to the coupling distributions illustrated in the embodiments of FIG. 4A through FIG. 5C between I[i−1] number of conductors of the (i−1)-th level of conductors of I[i−1] number of conductors and the (i−1)-th level of conductors of D[i] sets of conductors of I[1] number of conductors, the switch couplings can either be global or local, based on the T parameter of the PSN-(C) formulations. The various L-PSN embodiments can thus be illustrated with switch couplings between two consecutive levels of conductors.

Figure 6A:
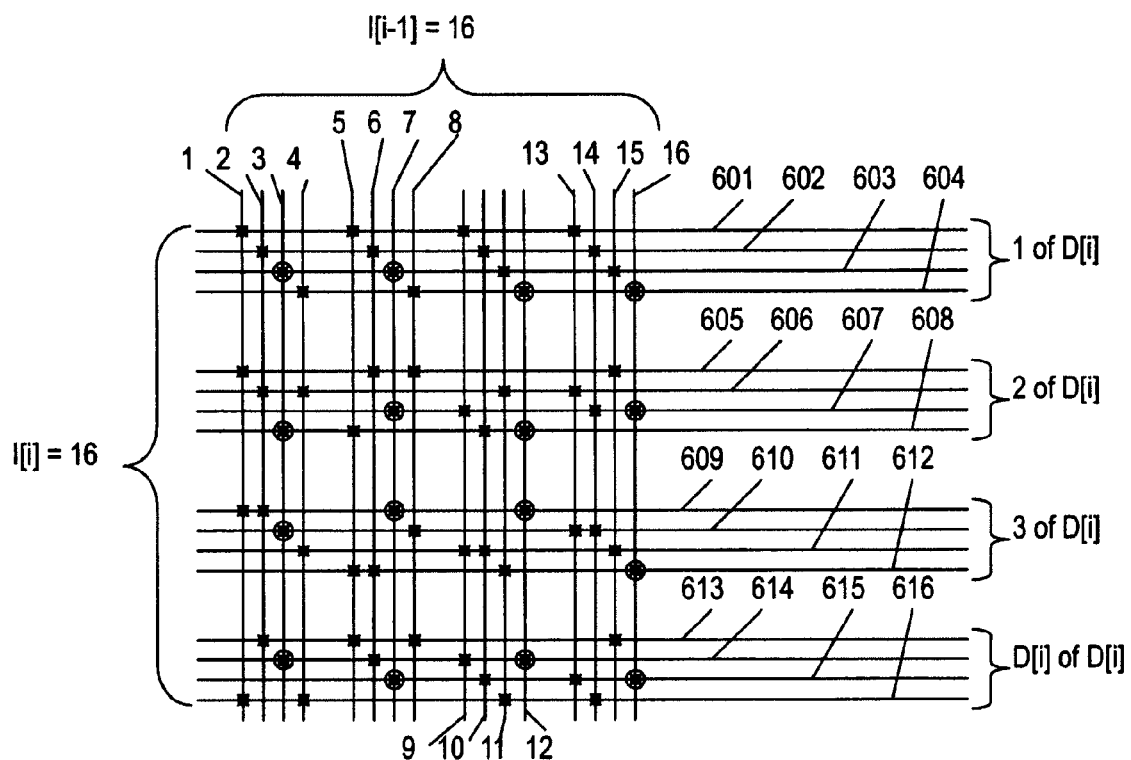
FIG. 6A illustrates one embodiment of switch couplings between two levels of conductors of a generic L-PSN with I[i−1]=16, I[i]=16, D[i]=4 and (I[i−1]×D[i]) 64 switches.

If one of the objectives is to increase the minimum number of coupling-conductors, CC, to a higher range in response to any combination of source-conductors, SC, the embodiment of FIG. 6A offers an illustration of coupling relations between two levels of conductors meeting the formulations PSN-(A) through PSN-(C) of L-PSN with generally increased number of coupling-conductors in response to any source-conductors, compared to various L-PSNs illustrated in the embodiments of FIG. 2A through FIG. 5C. The embodiment of FIG. 6A illustrates an (i−1)-th level of conductors of I[i−1]=16 number of conductors, [1:16], coupling to the i-th level of conductors of D[i] sets of conductors of I[i]=16 number of conductors, [601:604], [605:608], [609:612], [613:616] following the PSN-(A) through PSN-(C) formulations where the number of coupling-conductors, CC, is generally better than the PSN-(2) properties: In FIG. 6A, the minimum number of coupling-conductors, CC, is equal to nine selectively coupled to any SC=D$_S$[i]=4 which is greater than the PSN-(2) properties where CC=(SC+D[i]−1)=(D[i]+D[i]−1)=7. For example, as illustrated by the circles indicating selected switches coupling between source-conductors and coupling-conductors in FIG. 6A, the SC=D$_S$[i]=4 conductors (3, 7, 12, 16) couple to (603, 604) of the first set of D[i] sets, (607, 608) of the second set of D[i] sets, (609, 610, 612) of the third set of D[i] sets and (614, 615) of the last set of D[i] sets with a total of nine coupling-conductors which is greater than CC=(D[i]+D[i]−1)=7.

It is interesting to note that, there are 1,820 combinatorics combinations of SC=D[i]=4 cases for the L-PSN example of FIG. 6A, same as the number of combinatorics cases of the conventional L-SN embodiment of FIG. 1A for i=1; the number of combinatorics cases can be generally expressed using factorial combinations formula: {I[i−1]!/[(I[i−1]−SC)!×SC!]}. Additionally, the product sum of the distributions for SC=D[i]=4, the product sum, $\Pi_{j=[D[i]:I[i]]}$ (j×X[j])=21,200, where j is the number of coupling-conductors which ranges from D[i] to I[i] and X[j] is the number of cases or occurrences for each j given SC=D[i]=4 for the L-PSN example of FIG. 6A, the product sum is the same as the illustrated embodiment of FIG. 1A for i=1. Specifically, for SC=D$_S$[i] in the embodiment of FIG. 6A, there are four cases where CC=9, ninety six cases where CC=10, seven hundred cases of CC=11, seven hundred and eighty eight cases of CC=12, two hundred and four cases for CC=13, twenty four cases for CC=14 and four cases for CC=15; in the case of the conventional embodiment of FIG. 1A, for SC=D$_S$[i] where i=1, there are four cases for CC=4, four hundred and eight case for CC=8, eleven hundred fifty two cases for CC=12 and two hundred fifty six cases for CC=16.

The switch coupling patterns in the embodiment of FIG. 6A, following the PSN-(A) through PSN-(C) formulations, can be constructed from a basic numbering sequence of the I[i−1] number of conductors of the (i−1)-th level of conductors:

By labeling the I[i−1] number of conductors sequentially as [1:I[i−1]], namely, [1:16], with $D_S[i]$=(I[i−1]/I[i])×D[i]=4 and there are thus (I[i−1]/D[i])=4 groups of $D_S[i]$ number of conductors for the I[i−1] number of conductors, an "Original Sequence" can be constructed as (I[i−1]/D[i]) groups of $D_S[i]$ number of conductors consecutively: {[1:4], [5:8], [9:12], [13:16]}; a "Transpose Sequence" can be constructed as the transpose of the Original Sequence, the particular step value used in the transpose can be selected from a wide variety of parameters such as $D_S[i]$, D[i], $D_S[i+1]$, (D[i]×$D_S[i]$), (I[i]/D[i]), etc. and in the embodiment of FIG. 6A, (I[i]/D[i])=4 is used as the transpose step: {[1, 5, 9, 13], [2, 6, 10, 14], [3, 7, 11, 15], [4, 8, 12, 16]}; a "Prime 7 Sequence" can be constructed as the prime 7 distribution of the Original Sequence: {[1, 8, 15, 6], [13, 4, 11, 2], [9, 16, 7, 14], [5, 12, 3, 10]}; the "Prime 11 Sequence" can be constructed as the prime 11 distribution of the Original Sequence: {[1, 12, 7, 2], [13, 8, 3, 14], [9, 4, 15, 10], [5, 16, 11, 6]}; and the "Prime 13 Sequence" (with a starting number of 8) can be constructed as the prime 13 distribution of the Original Sequence: {[8, 5, 2, 15], [12, 9, 6, 3], [16, 13, 10, 7], [4, 1, 14, 11]}.

Thus each of the conductors (601, 602, 603, 604) of the first set of the D[i] sets of I[i] number of conductors of FIG. 6A connects to respectively the conductors of [1:16] using the Transpose Sequence, e.g. 601 couples to each of (1, 5, 9, 13) through a respective switch, 602 couples to each of (2, 6, 10, 14) through a respective switch, 603 couples to each of (3, 7, 11, 15) through a respective switch and 604 couples to each of (4, 8, 12, 16) through a respective switch. Similarly, the conductors (605, 606, 607, 608) of the second set of the D[i] sets of FIG. 6A couple to the conductors [1:16] using the Prime 7 Sequence, the conductors (609, 610, 611, 612) of the third set of the D[i] sets of FIG. 6A couple to the conductors [1:16] using the Prime 11 Sequence and the conductors (613, 614, 615, 616) of the last set of the D[i] sets of FIG. 6A couple to the conductors [1:16] using the Prime 13 Sequence with the starting number eight.

Figure 1C:
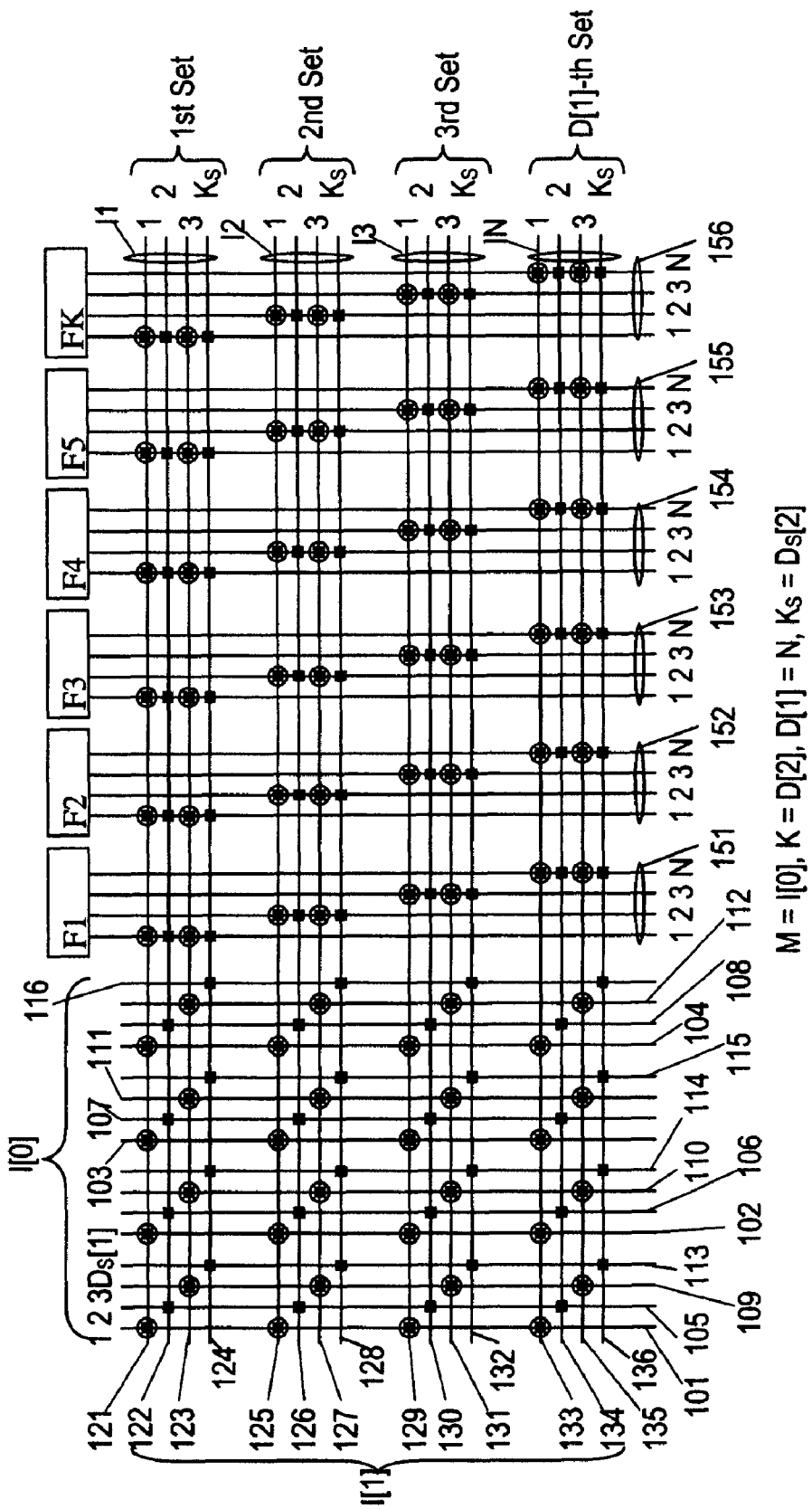
FIG. 1C is an equivalent redrawing of the embodiment of FIG. 1B.

It is noted that for i=1, the conventional 1-SN embodiment of FIG. 1A can be constructed where the conductors in each of the D[i] sets couple to the I[i−1] number of conductors using the Original Sequence; and for i=1, the 1-SN embodiment of FIG. 1C can be constructed where the conductors in each of the D[i] sets couple to the I[i−1] number of conductors using the Transpose Sequence.

There are numerous equivalents due to the factorial nature of combinatorics for an L-PSN. For example, the embodiment of FIG. 6B is the same L-PSN as that of FIG. 6A: by redrawing the sequence label of the I[i−1] number of conductors [1:16] of FIG. 6A to an alternative sequence [1, 13, 9, 5, 6, 2, 14, 10, 5, 11, 7, 3, 8, 4, 16, 12], FIG. 6B illustrates the same L-PSN of FIG. 6A with the alternative sequence; consequently, there can be many other equivalent redraws.

Figure 6B:
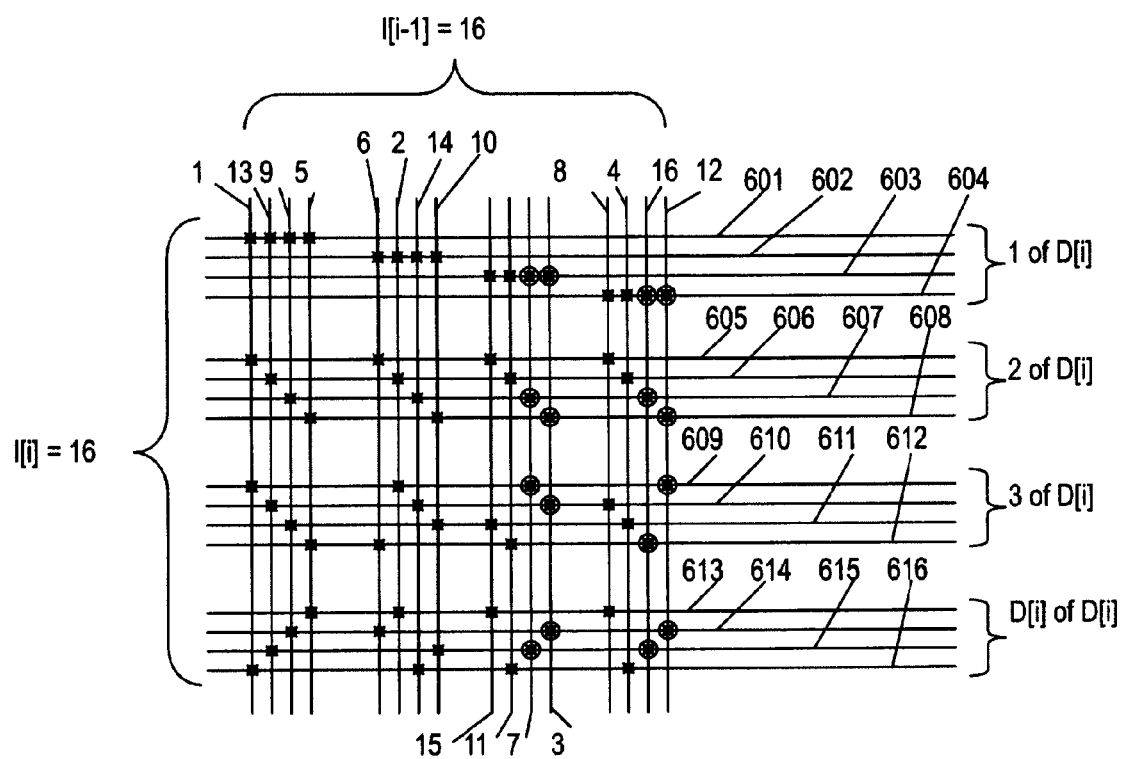
FIG. 6B illustrates an equivalent redraw of FIG. 6A.
Figure 6C:
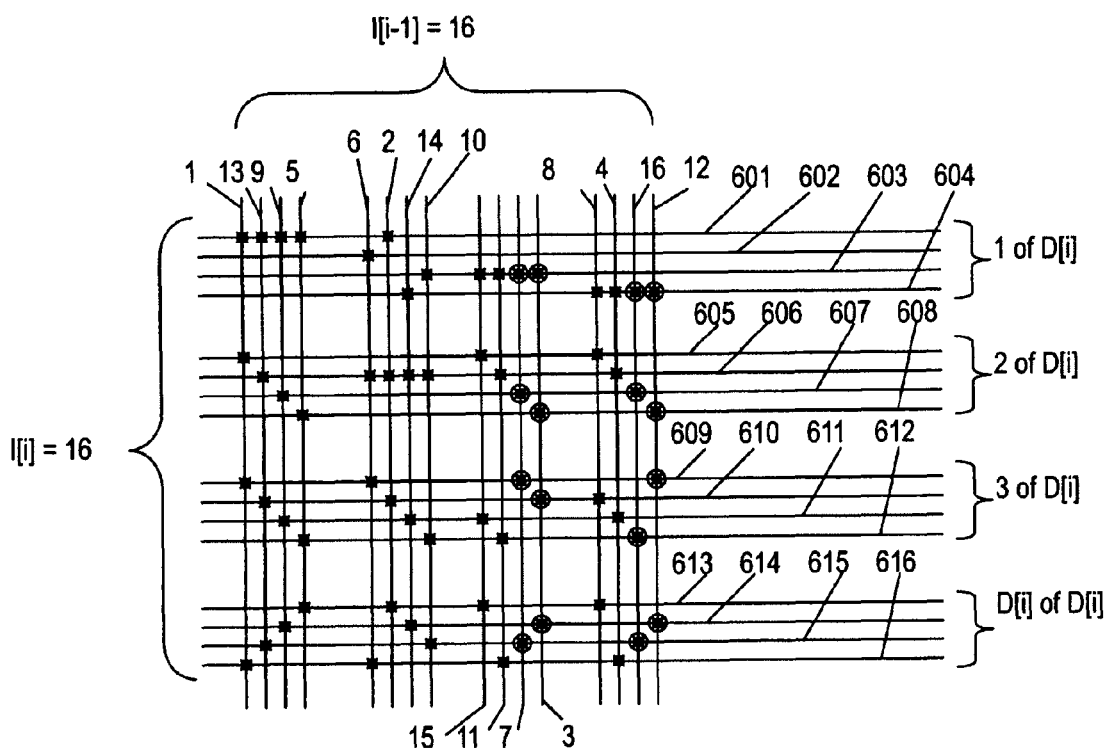
FIG. 6C illustrates one embodiment of a permutation of switch couplings of FIG. 6B.
Figure 6D:
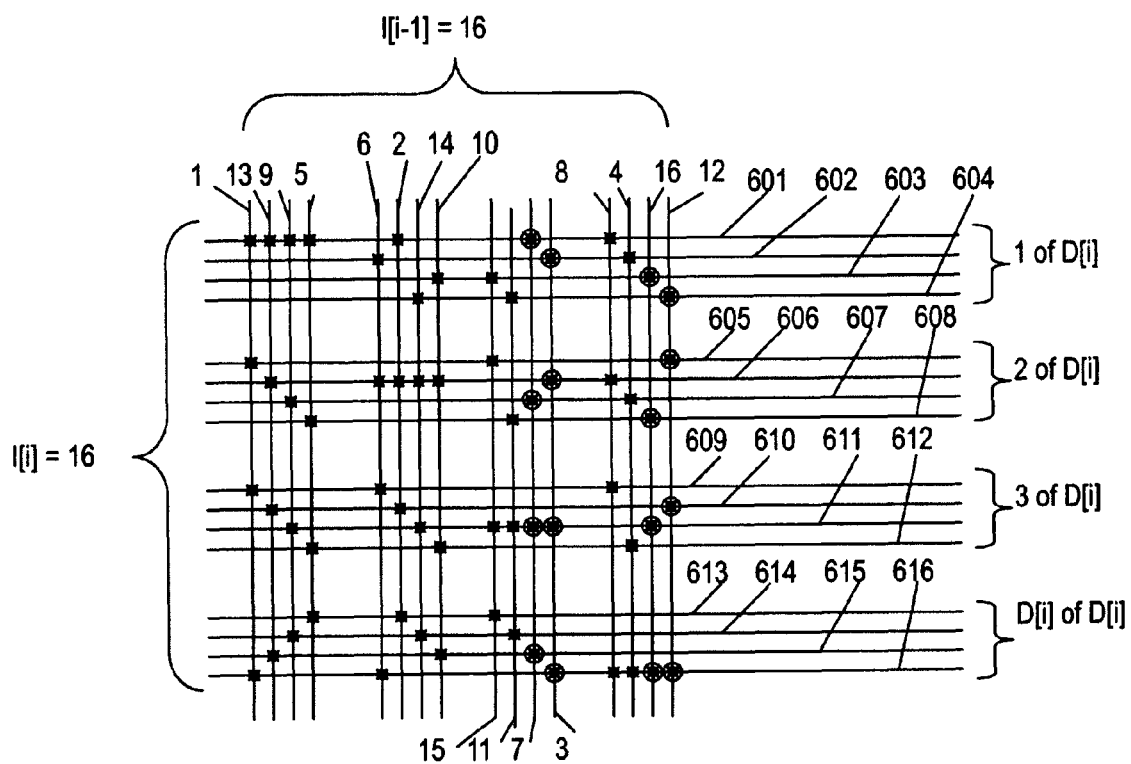
FIG. 6D illustrates another embodiment of a permutation of switch couplings of FIG. 6B.

The switch connection patterns coupling between a $D_S[i]$ number of source-conductors of the I[i−1] number of conductors of the (i−1)-th level of conductors and the i-th level of conductors of I[i] number of conductors consisting of D[i] sets of conductors can be permuted, for example, by permuting the switch coupling patterns between [6, 2, 14, 10] and the D[i] sets of conductors [601:604], [605:608], [609:612], [612:616] of FIG. 6B as illustrated in FIG. 6C; the permuted switch coupling patterns of FIG. 6C meets the PSN-(A) through PSN-(C) formulations and has at least the PSN-(1) properties. FIG. 6D illustrates another L-PSN embodiment by permuting column-wise the switch coupling patterns between each of the $D_S[i]$ number of conductors (6, 2, 14, 10), (15, 11, 7, 3), (8, 4, 16, 12) and the D[i] sets of conductors [601:604], [605:608], [609:612], [613:616] similar to the scheme described in FIG. 6C. The permuted L-PSN of FIG. 6D follows the PSN-(A) through PSN-(C) formulations and has at least the PSN-(1) properties.

The various embodiments illustrated in FIG. 2A through FIG. 6A exhibit generally increasing number of coupling-conductors with respect to increased number of source-conductors and specifically for FIG. 6A: for any SC=2, there are four cases where the minimum number of CC is equal to six; for SC=3, there are eight cases where the minimum number of CC is equal to eight; for SC=4, there are four cases where the minimum number of CC is equal to nine; for SC=5, there are eighty cases where the minimum number of CC is equal to eleven; for SC=6, there are one hundred and sixteen cases where the minimum number of CC is equal to twelve, etc.

Figure 7A:
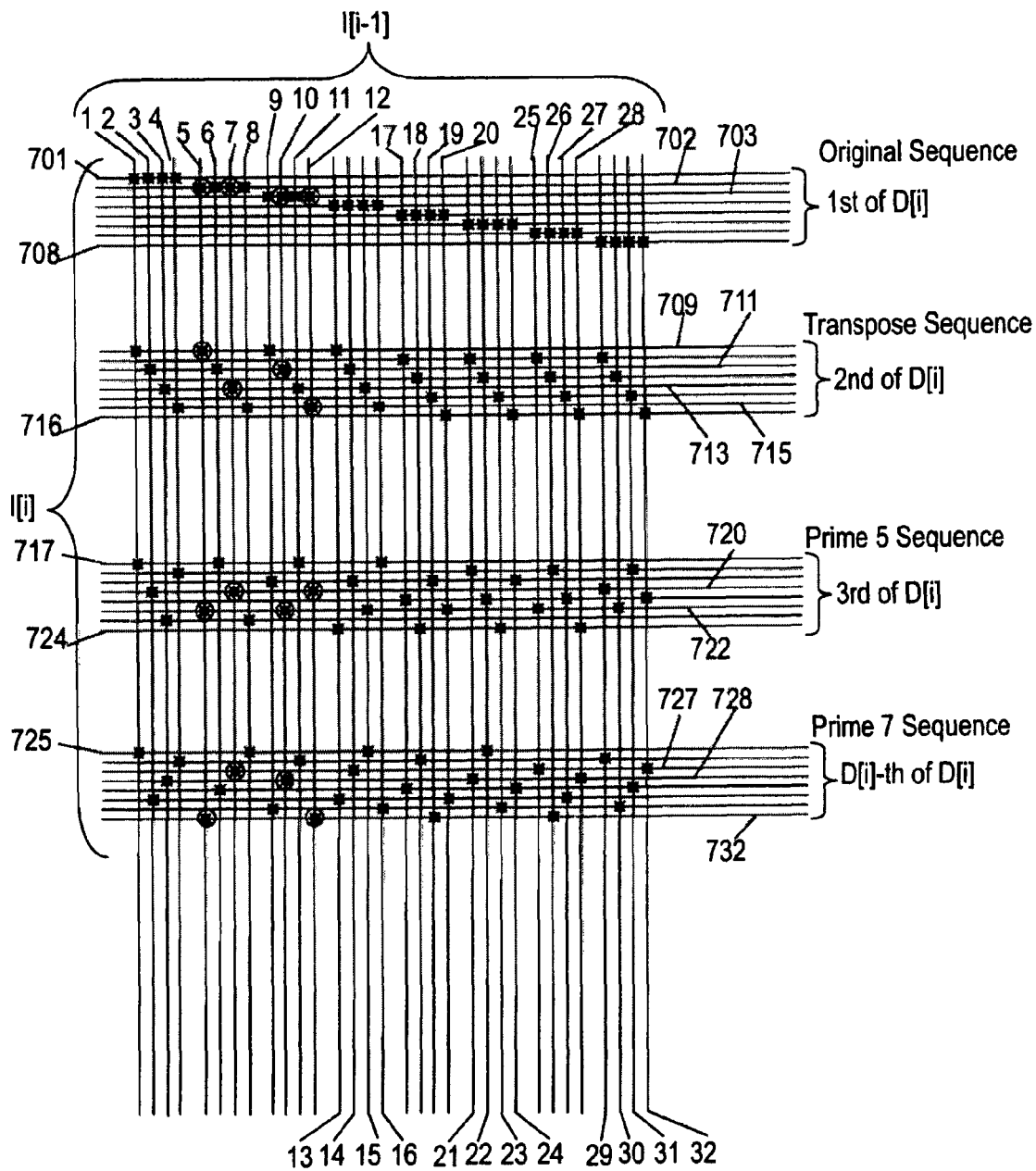
FIG. 7A illustrates one embodiment of switch couplings between two levels of conductors of a generic L-PSN with I[i−1]=I[i]=32, D[i]=4 and (I[i−1]×D[i])=128 switches.

FIG. 7A illustrates one embodiment of a L-PSN where I[i−1]=I[i]=32, $D_S[i]$=4 and D[i]=4; in this embodiment where there are (I[i]/D[i])=2×D[i]=8 number of conductors in each of the D[i] sets of conductors, for SC=$D_S[i]$=4, the minimum number of coupling-conductors is CC=11 which is greater than (SC+D[i]−1)=7, the properties of PSN-(2). In the embodiment of FIG. 7A, the first set of I[i] number of conductors consisting of D[i] sets of conductors is constructed using the Original Sequence, the second set of I[i] number of conductors consisting of D[i] sets of conductors is constructed using the Transpose Sequence with $D_S[i]$ as the step, the third set of I[i] number of conductors consisting of D[i] sets of conductors is constructed using the Prime 5 Sequence and the D[i]-th set of I[i] number of conductors consisting of D[i] sets of conductors is constructed using the Prime 7 Sequence. There are 35,960 combinational cases in the L-PSN example of FIG. 7A with 362 cases with minimum CC value at eleven; as an example, one of the minimum number of CC occurs with the combination of the SC number of source-conductors, (5, 7, 10, 12), where there are eleven coupling-conductors (702, 703, 709, 711, 713, 715, 720, 722, 727, 728, 732), through the selected switches indicated by the circles.

The L-PSN illustrated in the embodiments of FIG. 6A (and FIG. 6B) has D[i] number of conductors in each of the I[i] number of conductors consisting of D[i] sets of conductors and each conductor in each of the D[i] sets couples to $D_S[i]$ number of conductors of the I[i−1] number of conductors through $D_S[i]$ number of switches. The L-PSN of the type illustrated in the embodiment of FIG. 6A where each D[i] set of conductors has D[i] number of conductors has the additional properties that any two source-conductors SC=2 are selectively coupled to at least CC=4 number of coupling-conductors selected from any three sets of the D[i] sets of conductors, for D[i]>2; for example, the minimum CC=4 occurs for SC=2 with (7, 16) which are coupled to (603, 604) of the 1st D[i] set, 607 of the second D[i] set and 615 of the D[i]-th set. While in FIG. 7A, where each of the D[i] sets has (2×D[i]) number of conductors, it is readily determined that, for any two source-conductors, SC=2, the number of coupling-conductors, CC, selected from any two sets of the D[i] sets, is at least three.

Figure 7B:
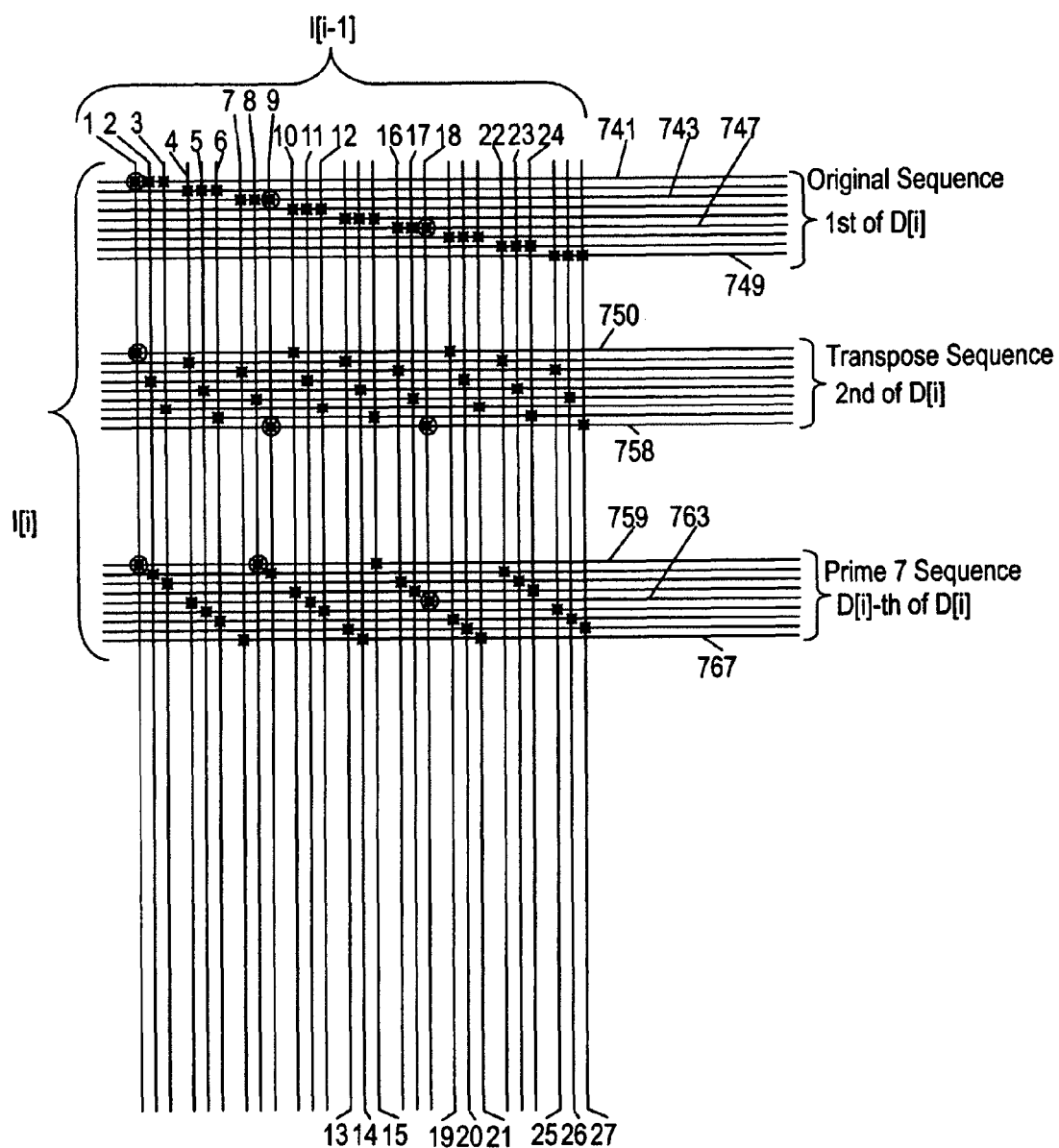
FIG. 7B illustrates one embodiment of switch couplings between two levels of conductors of a generic L-PSN with I[i−1]=I[i]=27, D[i]=3 and (I[i−1]×D[i])=81 switches.

FIG. 7B illustrates one embodiment of a L-PSN where I[i−1]=27, $D_S[i]$=3, D[i]=3 and I[i]=D[i]×(D[i]×$D_S[i]$)=27; the minimum number of coupling-conductors in this embodiment is CC=$D_S[i]$×(D[i]−1)+1=7 for SC=$D_S[i]$=3. The switch couplings of the two levels of conductors of an L-PSN illustrated in the embodiment of FIG. 7B is constructed with the first set of the D[i] sets using the Original Sequence, the second set of the D[i] sets using the Transpose Sequence with (I[i]/D[i]) as the step and the last or the D[i]-th set using Prime 7 Sequence. There are 2,925 combinations for $SC=D_S[i]=3$ with 351 cases with minimum $CC=D_S[i] \times (D[i]-1)+1=7$ which is greater than the properties of PSN-(2) in FIG. 7B; one of the minimum CC occurs with (1, 9, 18) as the $D_S[i]$ number of source-conductors of the I[i−1] number of conductors with seven coupling-conductors (741, 743, 747, 750, 758, 759, 763) where the circles indicated switches coupling between the SC number of source-conductors and the CC number of coupling-conductors. Similar to FIG. 7A, for any source conductors SC=2, the number of coupling-conductors, CC, selected from any two sets of the D[i] number of sets, is at least equal to three in FIG. 7B. In both FIG. 7A and FIG. 7B, there is generally increased number of coupling-conductors given increased number of source-conductors, similar to those of FIG. 6A.

With $I[i] \geq (D[i] \times D[i] \times D_S[i])$ for an i=[1:L+1] in an L-PSN, there can be further increase in the minimum number of coupling-conductors, CC, of I[i] in response to any $SC=D_S[i]$, the source-conductors of I[i−1]:

PSN-(3) Any $SC=D_S[i]$ number of source-conductors of I[i−1] number of conductors of the (i−1)-th level of conductors are selectively coupled to at least $CC=(D_S[i] \times (D[i]-1)+1)$ number of coupling-conductors of the i-th level of conductors of I[i] number of conductors consisting of D[i] sets of conductors.

As illustrated in the embodiments of FIG. 6B through FIG. 6D, any L-PSN couplings between two consecutive levels of conductors can be redrawn to have $(I[i-1]/D_S[i])$ number of $D_S[i]$-tuples of the I[i−1] number of conductors of the (i−1)-th level of conductors where each $D_S[i]$-tuple couples to one conductor of the I[i] number of conductors of the i-th level of conductors through $D_S[i]$ number of switches; those $D_S[i]$-tuples can either be coupling to $(I[i-1]/D_S[i])$ number of conductors of one of the D[i] sets of conductors of the i-th level of conductors (as illustrated in FIG. 6B) or can be coupling to multiple number of D[i] sets of conductors of the i-th level of conductors (as illustrated in FIG. 6C and FIG. 6D). There are a total of $(I[i-1]/D_S[i])$ number of $D_S[i]$-tuples where each $D_S[i]$-tuple couples to one conductor of the I[i] number of conductors through $D_S[i]$ number of switches thus there are a total of I[i−1] number of switches coupling the $D_S[i]$-tuples to the $(I[i-1]/D_S[i])$ number of conductors of the i-th level of conductors.

The various embodiments of FIG. 6A through FIG. 7B illustrate either a localized switch couplings of two sets or subsets of conductors of two consecutive levels of conductors or global switch couplings of all the conductors of two consecutive levels of conductors of an L-PSN which represent examples with more optimized number of CC number of coupling-conductors which are selectively coupled to a given SC number of source-conductors than those illustrated in FIG. 2A through FIG. 5C. The following additional coupling properties representing either local or global switch couplings of two sets or subsets of conductors of two consecutive levels of conductors prescribed by PSN-(A) through PSN-(C) formulations for another class of L-PSN described in the embodiments of FIG. 6A through FIG. 7B as follows:

PSN-(4): There are at most $(I[i-1]/D_S[i])$ groups of $D_S[i]$ number of conductors of the (i−1)-th level of conductors which selectively couple to $(I[i-1]/D_S[i])$ number of conductors of the i-th level of conductors through $D_S[i] \times (I[i-1]/D_S[i])=I[i-1]$ number of switches for an i selected from i=[1:L+1] where each of the $D_S[i]$ number of conductors of the (i−1)-th level of conductors selectively couple to a respective conductor of the $(I[i-1]/D_S[i])$ number of conductors of the i-th level of conductors through $D_S[i]$ number of switches of the I[i−1] number of switches.

There can be many variations in the design of an L-PSN, as illustrated by the many embodiments and illustrations, depending on the preferred engineering objectives where each of the L-PSN schemes with routing or interconnection enhancements compared to a corresponding L-SN when there are one or more multicasting signals distributed in a skewed fashion. The routing improvements in the L-PSN are the results of generally increased number of coupling-conductors coupling to any given number of source-conductors in the L-PSN compared to the conventional L-SN.

An L-PSN thus can be primarily comprised of (L+2) levels of conductors where majority of switch couplings between two levels of conductors of the L-PSN have identical switch couplings of a corresponding L-SN as long as there is a subset of conductors of two consecutive levels of conductors of the L-PSN meeting the of PSN-(A) through PSN-(C) formulations. Depending on the particulars of the L-PSN, the minimum number of coupling-conductors, CC, ranges between (D[i]+1) and $(D_S[i] \times (D[i]-1)+1)$ for any $SC=D_S[i]$ number of source-conductors and the minimum CC is monotonically increasing with increasing number of SC. Additionally, any L-PSN has one or more of the properties of PSN-(1) through PSN-(4).

The L-PSN switching networks can be used in conjunction with other interconnection mechanisms to form an interconnection fabric, for programmable logic circuits such as Field Programmable Gate Arrays (FPGAs) or used in a general interconnection network such as a network router. When the L-PSN is too small, there is no appreciable advantage, in terms of switch count, compared with many alternative interconnection schemes of the many conventional design; for a 1-PSN, for example, both N=D[1] and K=D[L+1] should be at least three; for an L-PSN, at least one of the D[i] should be greater than two and $D_S[i]$ in general should be at least two where L is greater than one.

Thus the L-PSN scheme can be used to enhance the selective connectability or routability of a corresponding conventional L-SN when there are one or more multicasting signals without adding more switches or conductors to the switching network. Using numerous embodiments and illustrations, a detailed description in building various enhanced multistage permutable switching networks is provided and used in various combinations to provide interconnect, both for inputs and outputs, for programmable logic circuits.

In some embodiments, the design and/or layout of the integrated circuits described above can be performed by a computing machine (e.g., a server, a personal computer, etc.) in response to instructions embodied in a machine-readable storage medium of an article of manufacture. Some examples of a machine-readable storage medium include any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

Thus, some embodiments of permutable switching network have been described. It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An integrated circuit, comprising: a L-level permutable switching network (L-PSN);
   wherein the L-PSN comprises (L+2) levels of conductors and (L+1) sets of switches:
   wherein the (L+2) levels of conductors comprises:
   for i=[1:L], (I[i]/D[i])>1, D[i]>1, L≧1, at least one j selected from [1:L] with D[j]>2, each of the i-th level of conductors comprises I[i] number of conductors comprising D[i] sets of conductors;
   an 0-th level of conductors of I[0] number of conductors,
   wherein (I[0]/$\Pi_{i=[1:L]}$ D[i])>1; and
   an (L+1)-th level of conductors of I[L+1] number of conductors comprising D[L+1] sets of conductors, wherein D[L+1]>2 and each of the D[L+1] sets of conductors comprises $\Pi_{i=[1:L]}$ D[i] number of conductors;
   wherein each i-th set of the (L+1) sets of switches comprises (I[i−1]×D[i]) number of switches for i=[1:L+1];
   wherein the I[i−1] number of conductors of the (i−1)-th level of conductors selectively couple to (I[i]/D[i]) number of conductors in each of the D[i] sets of conductors of the i-th level of conductors through a respective I[i−1] number of switches of the i-th set of switches for i=[1:L+1];
   wherein the $\Pi_{i=[1:L]}$ D[i] number of conductors in each of the D[L+1] sets of conductors of the (L+1)-th level of conductors are physically connected to a corresponding number of pins of a corresponding module; and
   at least one j selected from [1:L+1], T>1 and $D_S[j]$=D[j]×(I[j−1]/I[j], any (T×$D_S$[j]) number of conductors of the (j−1)-th level of conductors selectively couple to at least T number of conductors in each of the D[j] sets of conductors of the j-th level of conductors through (T×$D_S$[j]×D[j]) number of switches of the j-th set of switches,
   wherein any $D_S$[j] number of conductors selected from the (T×$D_S$[j]) number of conductors selectively couple to at least two conductors of at least one of the D[j] sets of conductors through a respective $D_S$[j] number of switches of the (T×$D_S$[j]×D[j]) number of switches.

2. The integrated circuit of claim 1, wherein any $D_S$[j] number of conductors of the (T×$D_S$[j]) number of conductors selectively couple to at least (D[j]+1) number of conductors of the D[j] sets of conductors through ($D_S$[j]×D[j]) number of switches of the (T×$D_S$[j]×D[j]) number of switches,
   wherein the (D[j]+1) number of conductors comprises at least one conductor of the at least T number of conductors in each of the D[j] sets of conductors.

3. The integrated circuit of claim 2, wherein T=(I[j−1]/$D_S$[j]).

4. The integrated circuit of claim 2, wherein each conductor in each of the D[j] sets of conductors selectively couples to $D_S$[j] number of conductors of the (j−1)-th level of conductors through $D_S$[j] number of switches of the respective I[j−1] number of switches.

5. The integrated circuit of claim 1, wherein any SC>0 number of the (T×$D_S$[j]) number of conductors selectively couple to CC number of conductors of the D[j] sets of conductors through (SC×D[j]) number of switches of the (T×$D_S$[j]×D[j]) number of switches,
   wherein the CC number of conductors comprises at least one conductor from the at least T number of conductors in each of the D[j] sets of conductors; and
   wherein CC is at least (SC+D[j]−1) and is at most (T×D[j]).

6. The integrated circuit of claim 5, wherein T=(I[j−1]/$D_S$[j]).

7. The integrated circuit of claim 5, wherein each conductor in each of the D[j] sets of conductors selectively couples to $D_S$[j] number of conductors of the (j−1)-th level of conductors through $D_S$[j] number of switches of the respective I[j−1] number of switches.

8. The integrated circuit of claim 1, wherein for T≧D[j]≧3, any SC=2 number of conductors of the (T×$D_S$[j]) number of conductors selectively couple to CC number of conductors of the at least T number of conductors of the D[j] sets of conductors through (SC×D[j]) number of switches of the (T×$D_S$[j]×D[j]) number of switches; and
   wherein the CC number of conductors comprises at least four conductors selected from the at least T number of conductors of any three sets of the D[j] sets of conductors.

9. The integrated circuit of claim 8, wherein T=(I[j−1]/$D_S$[j]).

10. The integrated circuit of claim 8, wherein each conductor in each of the D[j] sets of conductors selectively couples to $D_S$[j] number of conductors of the (j−1)-th level of conductors through $D_S$[j] number of switches of the respective I[j−1] number of switches.

11. The integrated circuit of claim 1, wherein for T≧2D[j], any SC=2 number of conductors of the (T×$D_S$[j]) number of conductors selectively couple to CC number of conductors of the D[j] sets of conductors through (SC×D[j]) number of switches of the (T×$D_S$[j]×D[j]) number of switches; and
   wherein the CC number of conductors comprises at least three conductors selected from the at least T number of conductors of any two sets of the D[j] sets of conductors.

12. The integrated circuit of claim 11, wherein T=(I[j−1]/$D_S$[j]).

13. The integrated circuit of claim 11, wherein each conductor in each of the D[j] sets of conductors selectively couples to $D_S$[j] number of conductors of the (j−1)-th level of conductors through $D_S$[j] number of switches of the respective I[j−1] number of switches.

14. The integrated circuit of claim 1, wherein for T≧($D_S$[j]×D[j]), any SC=$D_S$[j] number of conductors of the (T×$D_S$[j]) number of conductors selectively couple to CC number of conductors of the at least T number of conductors of the D[j] sets of conductors through (SC×D[j]) number of switches of the (T×$D_S$[j]×D[j]) number of switches; and
   wherein CC is at least $D_S$[j]×(D[j]−1)+1.

15. The integrated circuit of claim 14, wherein T=(I[j−1]/$D_S$[j]).

16. The integrated circuit of claim 14, wherein each conductor in each of the D[j] sets of conductors selectively couples to $D_S$[j] number of conductors of the (j−1)-th level of conductors through $D_S$[j] number of switches of the respective I[j−1] number of switches.

17. A method of manufacturing an integrated circuit, comprising:
   fabricating a L-level permutable switching network (L-PSN);
   wherein the L-PSN comprises (L+2) levels of conductors and (L+1) sets of switches:
   wherein the (L+2) levels of conductors comprises:
   for i=[1:L], (I[i]/D[i])>1, D[i]>1, L≧1, at least one j selected from [1:L] with D[j]>2, each of the i-th level of conductors comprises I[i] number of conductors comprising D[i] sets of conductors,
   an 0-th level of conductors of I[0] number of conductors,
   wherein 0[0]/$\Pi_{i=[1:L]}$ D[i])>1; and an (L+1)-th level of conductors of I[L+1] number of conductors comprising D[L+1] sets of conductors,
wherein D[L+1]>2 and each of the D[L+1] sets of conductors comprises $\Pi_{i=[1:L]} D[i]$ number of conductors;
wherein each i-th set of the (L+1) sets of switches comprises (I[i−1]×D[i]) number of switches for i=[1:L+1];
selectively coupling the I[i−1] number of conductors of the (i−1)-th level of conductors to (I[i]/D[i]) number of conductors in each of the D[i] sets of conductors of the i-th level of conductors through a respective I[i−1] number of switches of the i-th set of switches for i=[1:L+1];
physically connecting the $\Pi_{i=[1:L]} D[i]$ number of conductors in each of the D[L+1] sets of conductors of the (L+1)-th level of conductors to a corresponding number of pins of a corresponding module; and
selecting at least one j from [1:L+1], T>1 and $D_S[j]=D[j] \times (I[j-1]/I[j])$,
selectively coupling at least (T×$D_S$[j]) number of conductors of the (j−1)-th level of conductors to at least T number of conductors in each of the D[j] sets of conductors of the j-th level of conductors through (T×$D_S$[j]×D[j]) number of switches of the j-th set of switches, and
selectively coupling any $D_S$[j] number of conductors from the (T×$D_S$[j]) number of conductors of the (j−1)-th level of conductors to at least two conductors of at least one of the D[j] sets of conductors through a respective $D_S$[j] number of switches of the (T×$D_S$[j]×D[j]) number of switches.

18. The method of claim 17, further comprising selectively coupling any $D_S$[j] number of conductors of the (T×$D_S$[j]) number of conductors to at least (D[j]+1) number of conductors of the D[j] sets of conductors through ($D_S$[j]×D[j]) number of switches of the (T×$D_S$[j]×D[j]) number of switches,
wherein the (D[j]+1) number of conductors comprises at least one conductor of the at least T number of conductors in each of the D[j] sets of conductors.

19. The method of claim 18, wherein T=(I[j−1]/$D_S$[j]).

20. The method of claim 18, further comprising selectively coupling each conductor in each of the D[j] sets of conductors to $D_S$[j] number of conductors of the (j−1)-th level of conductors through $D_S$[j] number of switches of the respective I[j−1] number of switches.

21. The method of claim 17, further comprising selectively coupling any SC>0 number of the (T×$D_S$[j]) number of conductors to CC number of conductors of the D[j] sets of conductors through (SC×D[j]) number of switches of the (T×$D_S$[j]×D[j]) number of switches,
wherein the CC number of conductors comprises at least one conductor from the at least T number of conductors in each of the D[j] sets of conductors; and
wherein CC is at least (SC+D[j]−1) and is at most (T×D[j]).

22. The method of claim 21, wherein T=(I[j−1]/$D_S$[j]).

23. The method of claim 21, further comprising selectively coupling each conductor in each of the D[j] sets of conductors to $D_S$[j] number of conductors of the (j−1)-th level of conductors through $D_S$[j] number of switches of the respective I[j−1] number of switches.

24. The method of claim 17, further comprising selectively coupling, for T≧D[j]≧3, any SC=2 number of conductors of the (T×$D_S$[j]) number of conductors to CC number of conductors of the at least T number of conductors of the D[j] sets of conductors through (SC×D[j]) number of switches of the (T×$D_S$[j]×D[j]) number of switches,
wherein the CC number of conductors comprises at least four conductors selected from the at least T number of conductors of any three sets of the D[j] sets of conductors.

25. The method of claim 24, wherein T=(I[j−1]/$D_S$[j]).

26. The method of claim 24, further comprising selectively coupling each conductor in each of the D[j] sets of conductors to $D_S$[j] number of conductors of the (j−1)-th level of conductors through $D_S$[j] number of switches of the respective I[j−1] number of switches.

27. The method of claim 17, further comprising selectively coupling, for T≧2D[j], any SC=2 number of conductors of the (T×$D_S$[j]) number of conductors to CC number of conductors of the D[j] sets of conductors through (SC×D[j]) number of switches of the (T×$D_S$[j]×D[j]) number of switches,
wherein the CC number of conductors comprises at least three conductors selected from the at least T number of conductors of any two sets of the D[j] sets of conductors.

28. The method of claim 27, wherein T=(I[j−1]/$D_S$[j]).

29. The method of claim 27, further comprising selectively coupling each conductor in each of the D[j] sets of conductors to $D_S$[j] number of conductors of the (j−1)-th level of conductors through $D_S$[j] number of switches of the respective I[j−1] number of switches.

30. The method of claim 17, further comprising selectively coupling, for T≧($D_S$[j]×D[j]), any SC=$D_S$[j] number of conductors of the (T×$D_S$[j]) number of conductors to CC number of conductors of the at least T number of conductors of the D[j] sets of conductors through (SC×D[j]) number of switches of the (T×$D_S$[j]×D[j]) number of switches,
wherein CC is at least $D_S$[j]×(D[j]−1)+1.

31. The method of claim 30, wherein T=(I[j−1]/$D_S$[j]).

32. The method of claim 30, further comprising selectively coupling each conductor in each of the D[j] sets of conductors to $D_S$[j] number of conductors of the (j−1)-th level of conductors through $D_S$[j] number of switches of the respective I[j−1] number of switches.

33. An article of manufacture comprising a machine readable storage medium that stores data representing an integrated circuit layout, comprising: a L-level permutable switching network (L-PSN);
wherein the L-PSN comprises (L+2) levels of conductors and (L+1) sets of switches:
wherein the (L+2) levels of conductors comprises:
for i=[1:L], (I[i]/D[i])>1, D[i]>1, L≧1, at least one j selected from [1:L] with D[j]>2, each of the i-th level of conductors comprises I[i] number of conductors comprising D[i] sets of conductors;
an 0-th level of conductors of I[0] number of conductors,
wherein $0[0]/\Pi_{i=[1:L]} D[i])>1$; and
an (L+1)-th level of conductors of I[L+1] number of conductors comprising D[L+1] sets of conductors,
wherein D[L+1]>2 and each of the D[L+1] sets of conductors comprises $\Pi_{i=[1:L]} D[i]$ number of conductors;
wherein each i-th set of the (L+1) sets of switches comprises (I[i−1]×D[i]) number of switches for i=[1:L+1];
wherein the I[i−1] number of conductors of the (i−1)-th level of conductors selectively couple to (I[i]/D[i]) number of conductors in each of the D[i] sets of conductors of the i-th level of conductors through a respective I[i−1] number of switches of the i-th set of switches for i=[1: L+1];

wherein the $\Pi_{i=[1:L]} D[i]$ number of conductors in each of the D[L+1] sets of conductors of the (L+1)-th level of conductors are physically connected to a corresponding number of pins of a corresponding module; and at least one j selected from [1:L+1], T>1 and $D_S[j]=D[j]\times(I[j-1]/I[j])$, any $(T\times D_S[j])$ number of conductors of the (j−1)-th level of conductors selectively couple to at least T number of conductors in each of the D[j] sets of conductors of the j-th level of conductors through $(T\times D_S[j]\times D[j])$ number of switches of the j-th set of switches, wherein any $D_S[j]$ number of conductors selected from the $(T\times D_S[j])$ number of conductors selectively couple to at least two conductors of at least one of the D[j] sets of conductors through a respective $D_S[j]$ number of switches of the $(T\times D_S[j]\times D[j])$ number of switches.

34. The article of manufacture of claim 33, wherein any $D_S[j]$ number of conductors of the $(T\times D_S[j])$ number of conductors selectively couple to at least (D[j]+1) number of conductors of the D[j] sets of conductors through $(D_S[j]\times D[j])$ number of switches of the $(T\times D_S[j]\times D[j])$ number of switches, wherein the (D[j]+1) number of conductors comprises at least one conductor of the at least T number of conductors in each of the D[j] sets of conductors.

35. The article of manufacture of claim 34, wherein $T=(I[j-1]/D_S[j])$.

36. The article of manufacture of claim 34, wherein each conductor in each of the D[j] sets of conductors selectively couples to $D_S[j]$ number of conductors of the (j−1)-th level of conductors through $D_S[j]$ number of switches of the respective I[j−1] number of switches.

37. The article of manufacture of claim 33, wherein any SC>0 number of the $(T\times D_S[j])$ number of conductors selectively couple to CC number of conductors of the D[j] sets of conductors through $(SC\times D[j])$ number of switches of the $(T\times D_S[j]\times D[j])$ number of switches, wherein the CC number of conductors comprises at least one conductor from the at least T number of conductors in each of the D[j] sets of conductors; and wherein CC is at least (SC+D[j]−1) and is at most $(T\times D[j])$.

38. The article of manufacture of claim 37, wherein $T=(I[j-1]/D_S[j])$.

39. The article of manufacture of claim 37, wherein each conductor in each of the D[j] sets of conductors selectively couples to $D_S[j]$ number of conductors of the (j−1)-th level of conductors through $D_S[j]$ number of switches of the respective I[j−1] number of switches.

40. The article of manufacture of claim 33, wherein for $T\geq D[j]\geq 3$, any SC=2 number of conductors of the $(T\times D_S[j])$ number of conductors selectively couple to CC number of conductors of the at least T number of conductors of the D[j] sets of conductors through $(SC\times D[j])$ number of switches of the $(T\times D_S[j]\times D[j])$ number of switches; and wherein the CC number of conductors comprises at least four conductors selected from the at least T number of conductors of any three sets of the D[j] sets of conductors.

41. The article of manufacture of claim 40, wherein $T=(I[j-1]/D_S[j])$.

42. The article of manufacture of claim 40, wherein each conductor in each of the D[j] sets of conductors selectively couples to $D_S[j]$ number of conductors of the (j−1)-th level of conductors through $D_S[j]$ number of switches of the respective I[j−1] number of switches.

43. The article of manufacture of claim 33, wherein for $T\geq 2D[j]$, any SC=2 number of conductors of the $(T\times D_S[j])$ number of conductors selectively couple to CC number of conductors of the D[j] sets of conductors through $(SC\times D[j])$ number of switches of the $(T\times D_S[j]\times D[j])$ number of switches; and wherein the CC number of conductors comprises at least three conductors selected from the at least T number of conductors of any two sets of the D[j] sets of conductors.

44. The article of manufacture of claim 43, wherein $T=(I[j-1]/D_S[j])$.

45. The article of manufacture of claim 43, wherein each conductor in each of the D[j] sets of conductors selectively couples to $D_S[j]$ number of conductors of the (j−1)-th level of conductors through $D_S[j]$ number of switches of the respective I[j−1] number of switches.

46. The article of manufacture of claim 33, wherein for $T\geq(D_S[j]\times D[j])$, any $SC=D_S[j]$ number of conductors of the $(T\times D_S[j])$ number of conductors selectively couple to CC number of conductors of the at least T number of conductors of the D[j] sets of conductors through $(SC\times D[j])$ number of switches of the $(T\times D_S[j]\times D[j])$ number of switches; and wherein CC is at least $D_S[j]\times(D[j]-1)+1$.

47. The article of manufacture of claim 46, wherein $T=(I[j-1]/D_S[j])$.

48. The article of manufacture of claim 46, wherein each conductor in each of the D[j] sets of conductors selectively couples to $D_S[j]$ number of conductors of the (j−1)-th level of conductors through $D_S[j]$ number of switches of the respective I[j−1] number of switches.

* * * * *